(12) United States Patent
Oh

(10) Patent No.: US 11,502,092 B2
(45) Date of Patent: Nov. 15, 2022

(54) SEMICONDUCTOR MEMORY DEVICE AND METHOD FOR MANUFACTURING THE SAME

(71) Applicant: SK hynix Inc., Icheon-si (KR)

(72) Inventor: Sung Lae Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 210 days.

(21) Appl. No.: 16/897,108

(22) Filed: Jun. 9, 2020

(65) Prior Publication Data
US 2021/0217759 A1 Jul. 15, 2021

(30) Foreign Application Priority Data
Jan. 14, 2020 (KR) ........................ 10-2020-0004667

(51) Int. Cl.
| | |
|---|---|
| *H01L 27/11582* | (2017.01) |
| *H01L 27/11539* | (2017.01) |
| *H01L 27/11519* | (2017.01) |
| *H01L 27/11556* | (2017.01) |
| *H01L 23/528* | (2006.01) |
| *H01L 23/522* | (2006.01) |
| *H01L 27/11565* | (2017.01) |

(52) U.S. Cl.
CPC .... *H01L 27/11539* (2013.01); *H01L 23/5226* (2013.01); *H01L 23/5283* (2013.01); *H01L 27/11519* (2013.01); *H01L 27/11556* (2013.01); *H01L 27/11565* (2013.01); *H01L 27/11582* (2013.01)

(58) Field of Classification Search
CPC ..................... H01L 27/11582; H01L 27/11578
See application file for complete search history.

(56) References Cited

U.S. PATENT DOCUMENTS

| | | | |
|---|---|---|---|
| 2016/0163732 A1* | 6/2016 | Lim | H01L 27/11573 257/314 |
| 2017/0323898 A1* | 11/2017 | Oh | H01L 27/0688 |
| 2019/0067314 A1 | 2/2019 | Lu et al. | |
| 2020/0075398 A1* | 3/2020 | Shin | H01L 27/11548 |
| 2020/0227397 A1* | 7/2020 | Yada | H01L 27/11565 |
| 2021/0082941 A1* | 3/2021 | Son | H01L 27/1157 |
| 2021/0091105 A1* | 3/2021 | Kim | H01L 27/11556 |
| 2021/0125928 A1* | 4/2021 | Kim | H01L 21/76816 |

FOREIGN PATENT DOCUMENTS

KR 10-2021-0027938 A 3/2021

\* cited by examiner

*Primary Examiner* — Christopher A Johnson

(57) ABSTRACT

A semiconductor memory device includes a stack structure including a plurality of first dielectric layers alternately stacked with a plurality of second dielectric layers over a first substrate in a coupling region, and including a plurality of electrode layers alternately stacked with the plurality of first dielectric layers over the first substrate outside the coupling region; and a plurality of vias passing through the stack structure in a first direction that is perpendicular to a top surface of the first substrate and disposed at edges of the coupling region to define an etch barrier. Each of the plurality of vias comprising: a pillar portion extending in the first direction; and a plurality of extended portions, extending radially from an outer circumference of the pillar portion and parallel to the top surface of the first substrate, that are coextensive in the first direction with the plurality of second dielectric layers.

34 Claims, 36 Drawing Sheets

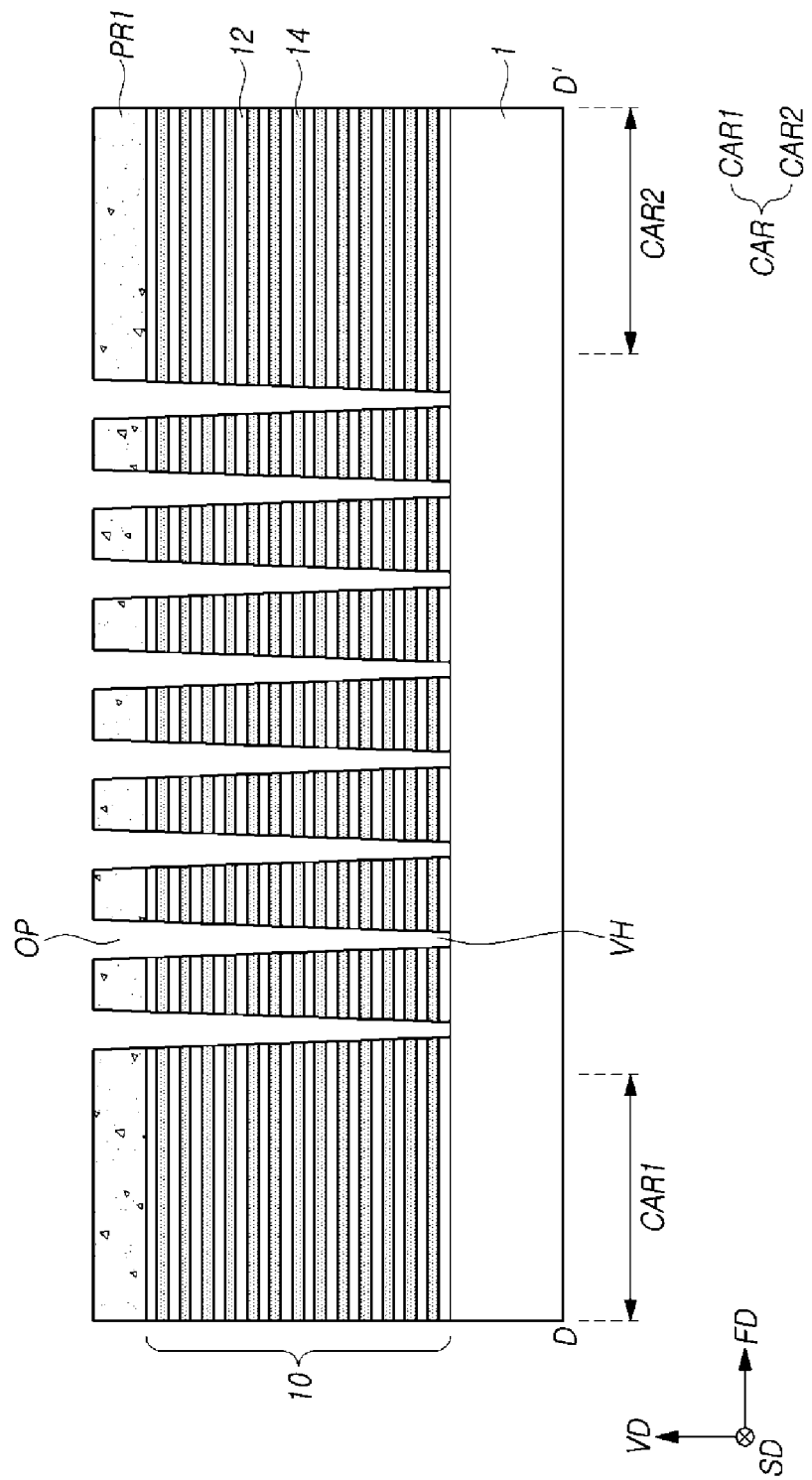

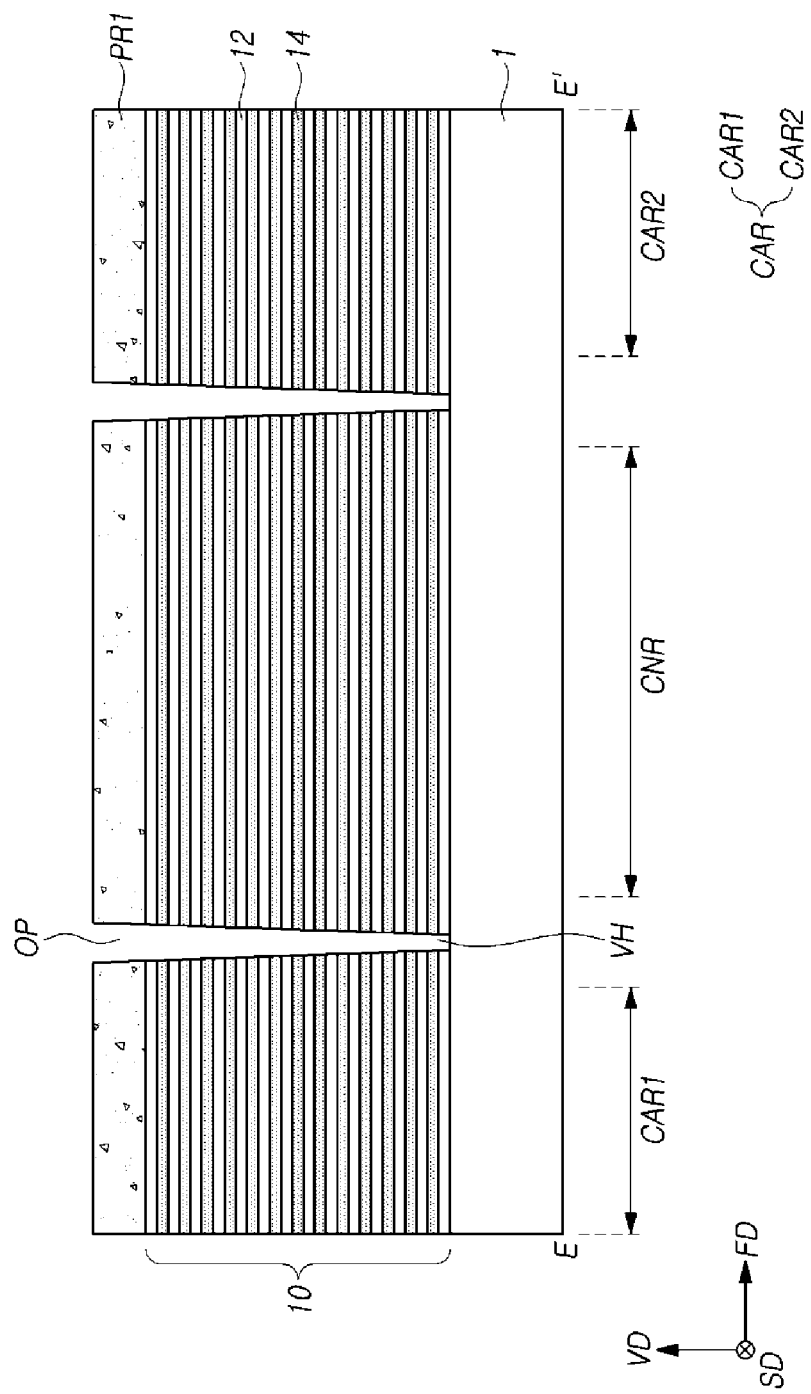

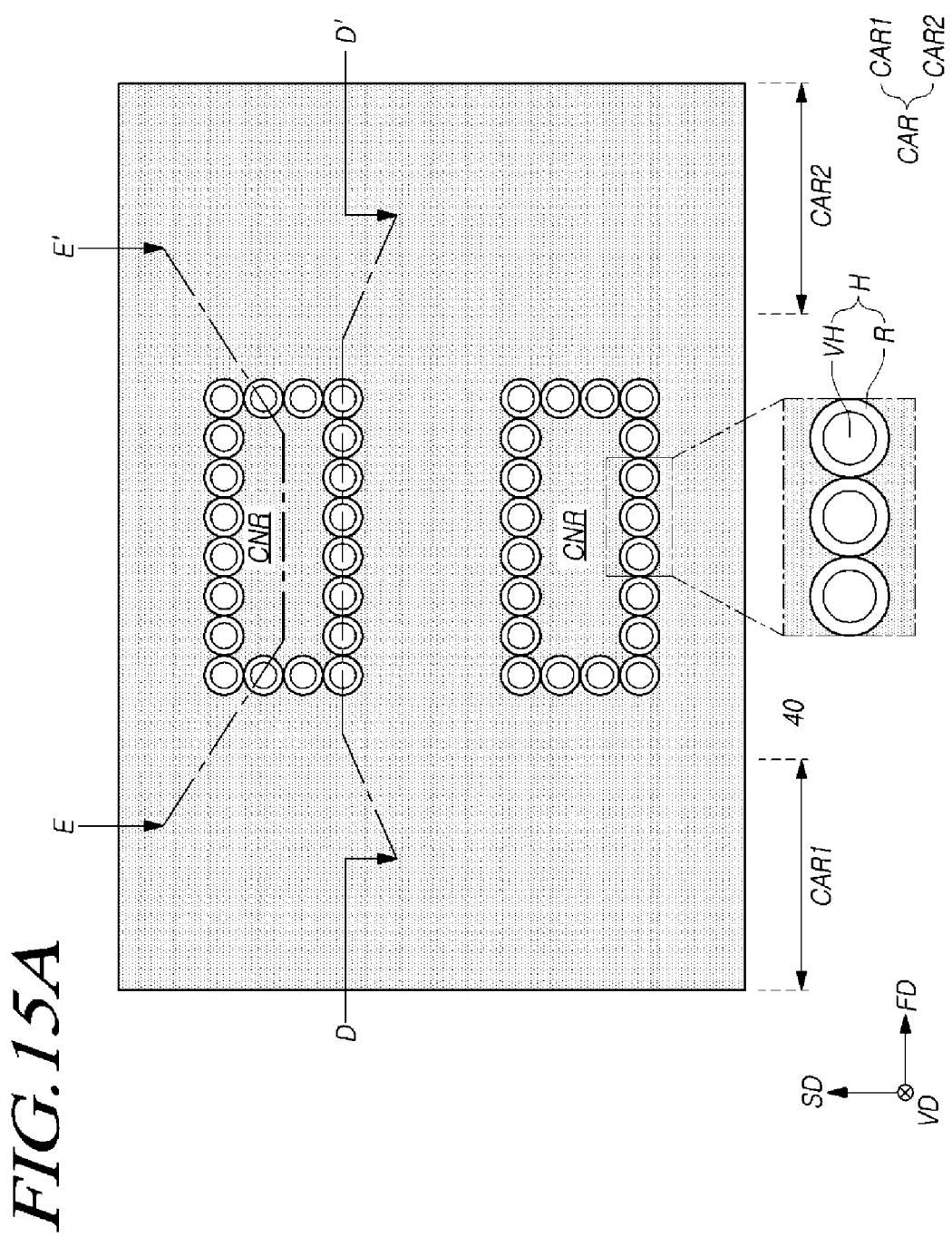

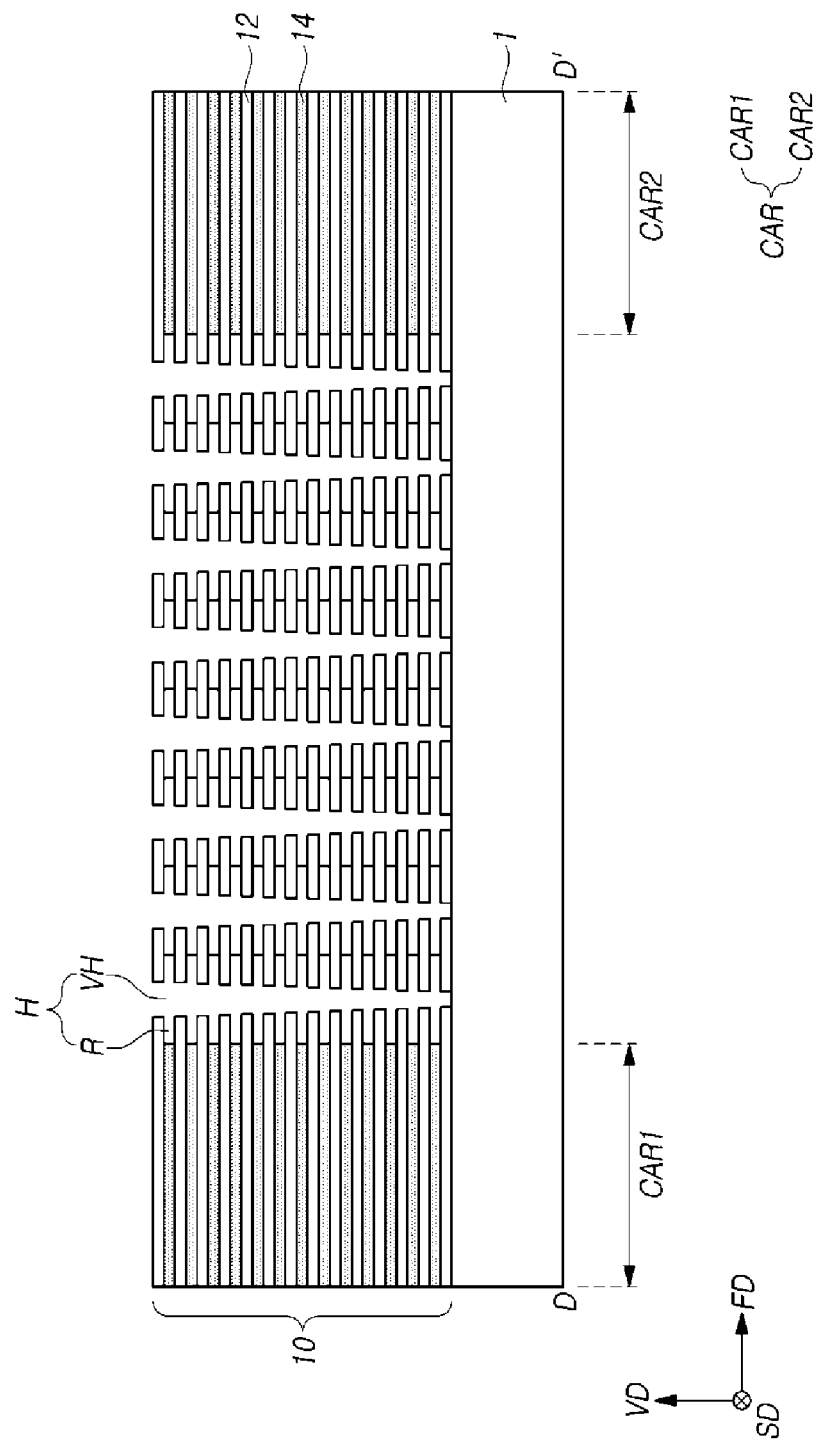

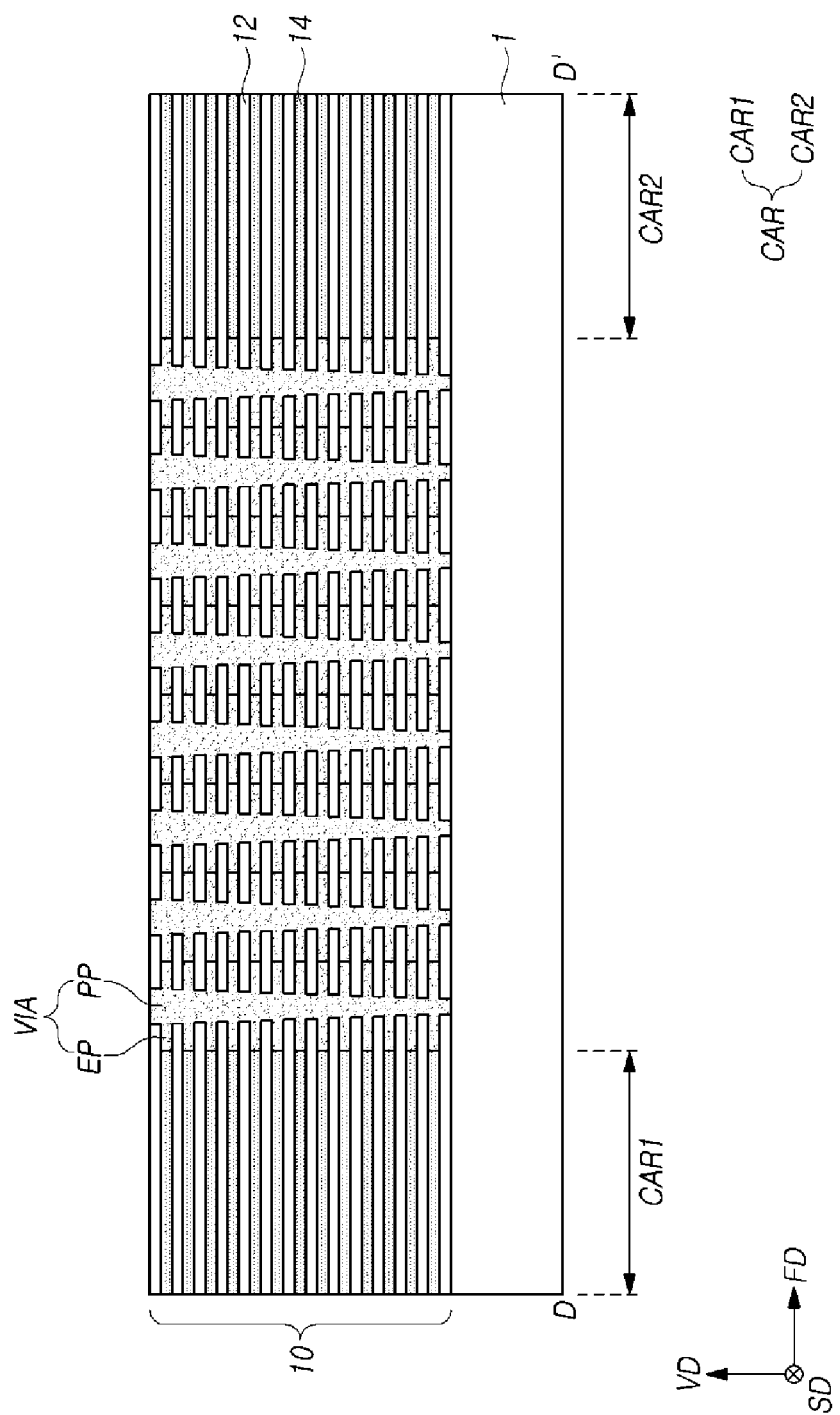

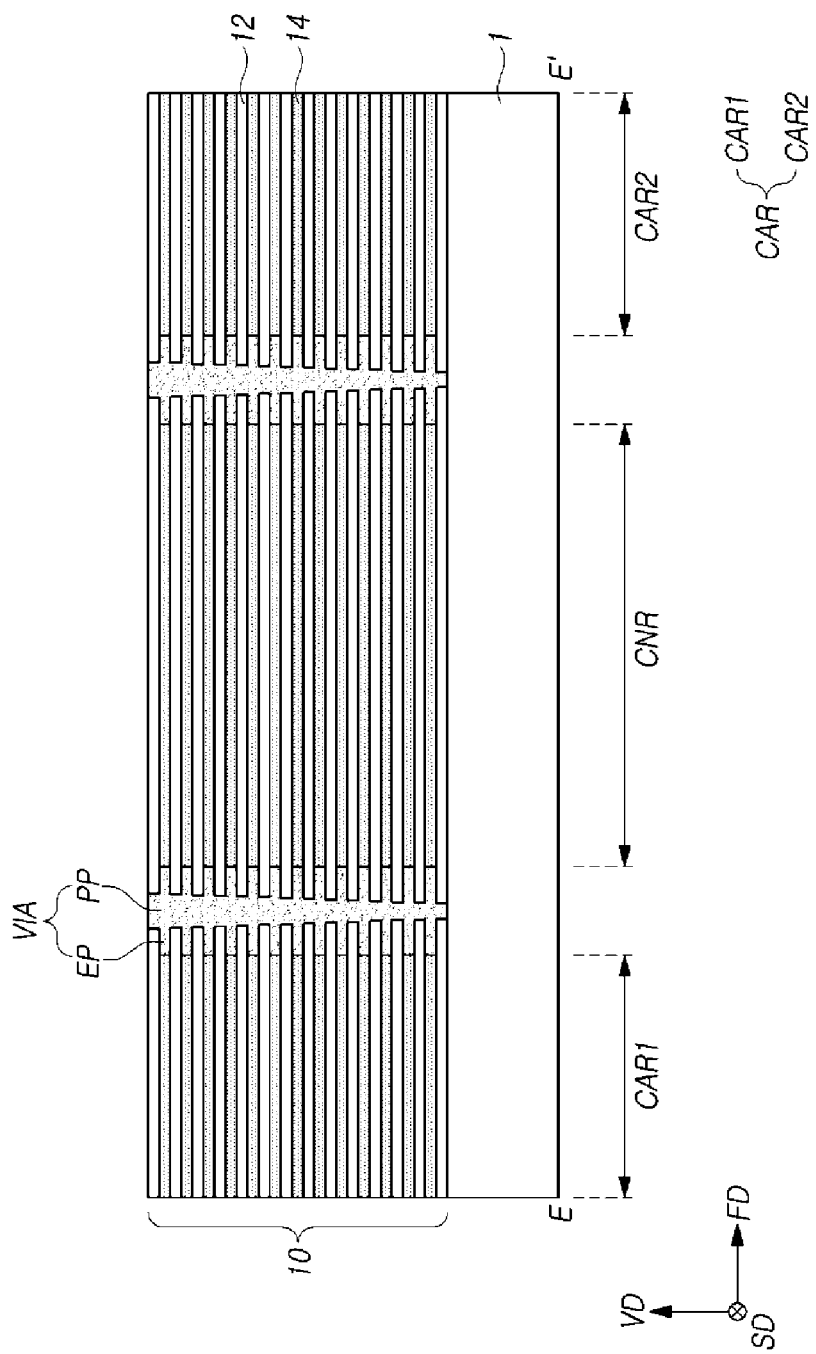

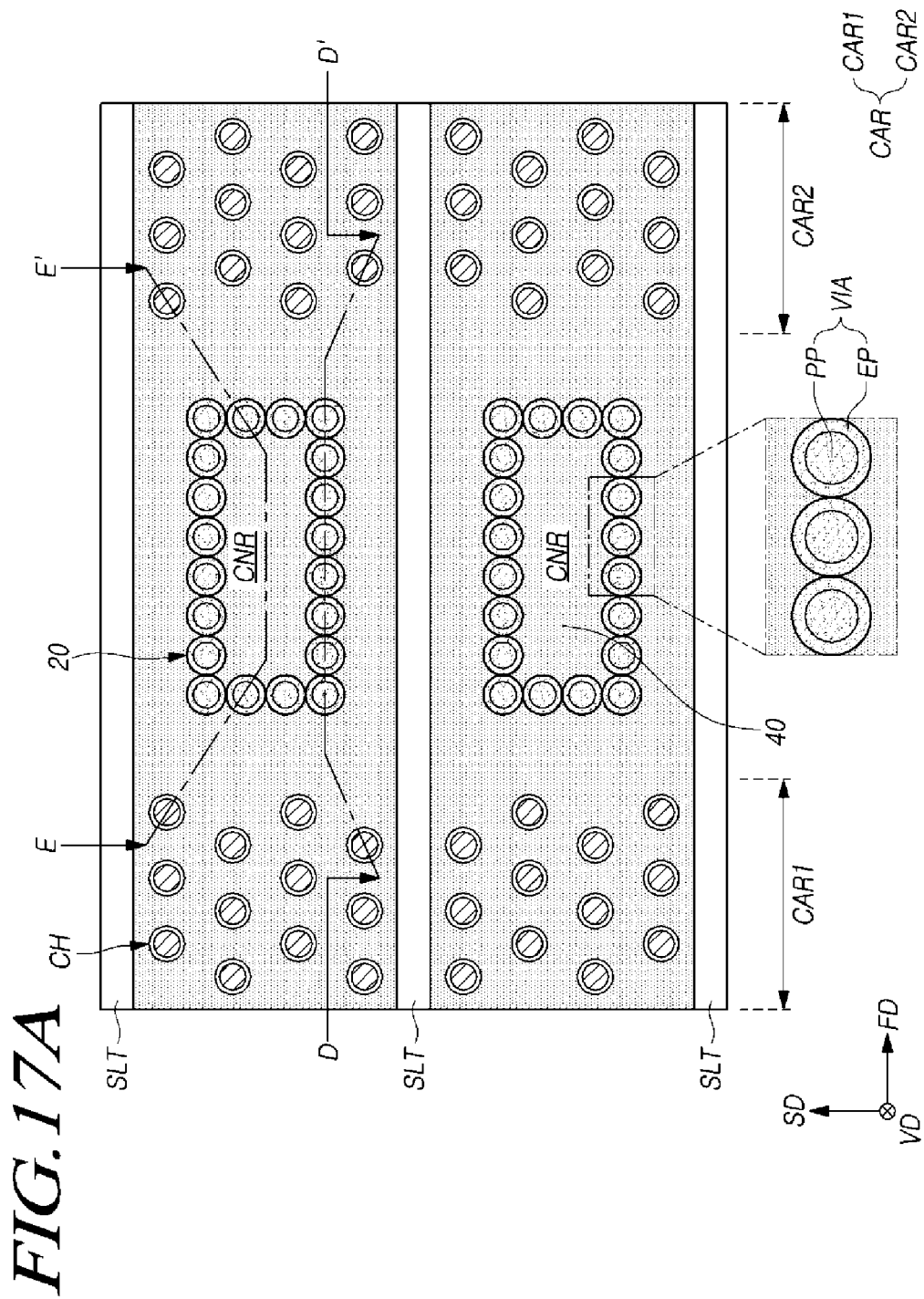

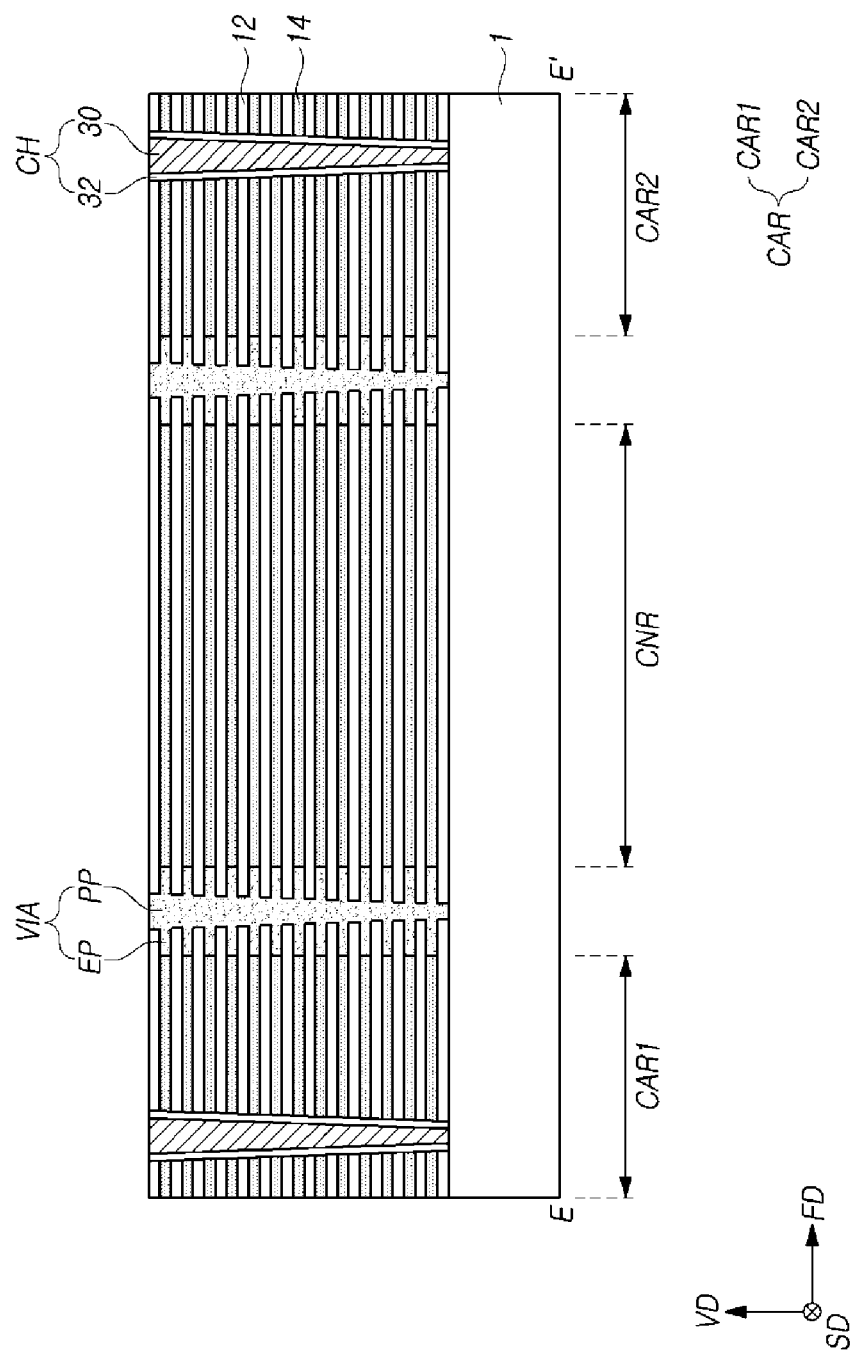

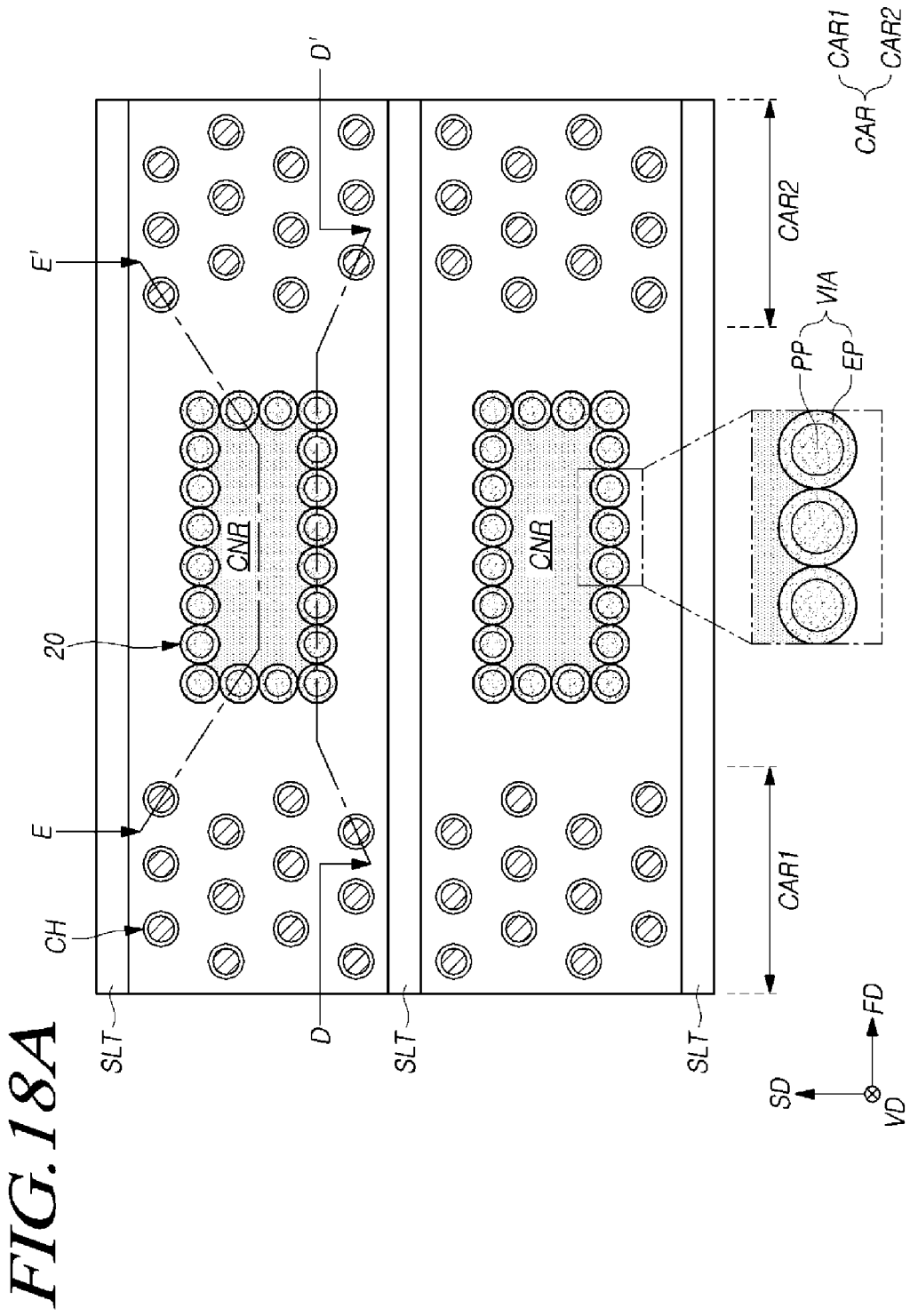

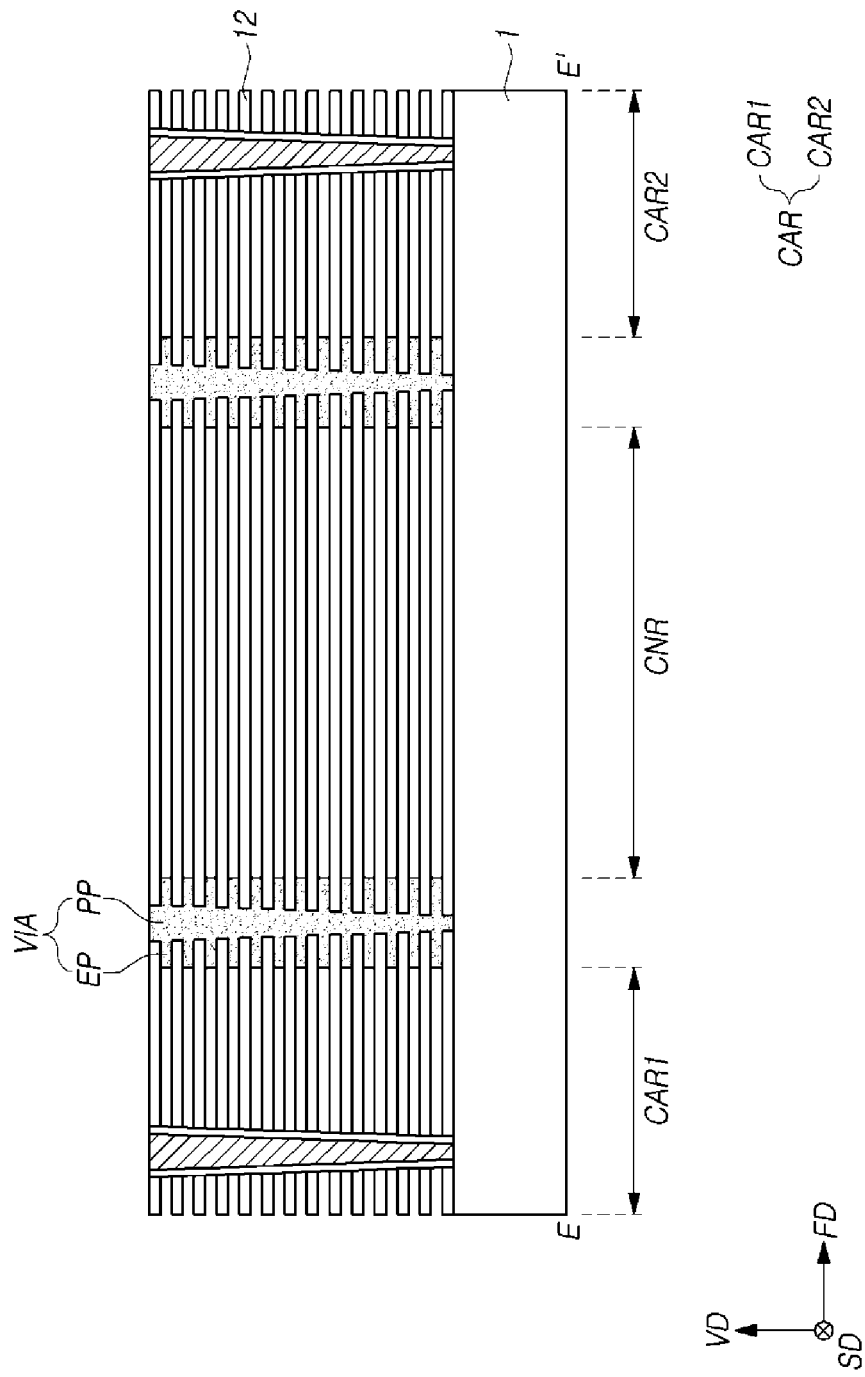

us 11,502,092 B2

SEMICONDUCTOR MEMORY DEVICE AND METHOD FOR MANUFACTURING THE SAME

CROSS-REFERENCE TO RELATED APPLICATION

The present application claims priority under 35 U.S.C. § 119(a) to Korean Patent Application No. 10-2020-0004667 filed in the Korean Intellectual Property Office on Jan. 14, 2020, which is incorporated herein by reference in its entirety.

BACKGROUND

1. Technical Field

Various embodiments generally relate to a semiconductor memory device, and particularly, to a semiconductor memory device having a three-dimensional structure and a method for manufacturing the same.

2. Related Art

In order to meet demands for excellent performance and low price that consumers demand, the degree of integration in a semiconductor memory device must increase. Since the degree of integration of a two-dimensional or planar semiconductor memory device is mainly determined by the area occupied by a unit memory cell, the degree of integration is greatly influenced by the level of a fine pattern forming technique. However, since highly expensive equipment is required for the formation of a fine pattern, the degree of integration of a two-dimensional semiconductor memory device is still limited, although it is increasing. To overcome such limitations, a semiconductor memory device that has a three-dimensional structure and includes three-dimensionally arranged memory cells has been proposed.

SUMMARY

Various embodiments of the disclosure are directed to semiconductor memory devices capable of improving electrical characteristics and suppressing occurrences of failures during manufacturing processes.

Also, various embodiments of the disclosure are directed to methods for manufacturing the semiconductor memory devices described above.

In an embodiment, a semiconductor memory device may include: a stack structure including a plurality of first dielectric layers alternately stacked with a plurality of second dielectric layers over a first substrate in a coupling region, and including a plurality of electrode layers alternately stacked with the plurality of first dielectric layers over the first substrate outside the coupling region; and a plurality of vias passing through the stack structure in a first direction that is perpendicular to a top surface of the first substrate and disposed at edges of the coupling region to define an etch barrier. Each of the plurality of vias comprising: a pillar portion extending in the first direction; and a plurality of extended portions, extending radially from an outer circumference of the pillar portion and parallel to the top surface of the first substrate, that are coextensive in the first direction with the plurality of second dielectric layers.

In an embodiment, a semiconductor memory device may include: a stack structure; and a plurality of vias passing through the stack structure and disposed at edges of a coupling region. The stack structure includes a plurality of first dielectric layers alternately stacked with a plurality of second dielectric layers in the coupling region, and includes a plurality of electrode layers alternately stacked with the plurality of first dielectric layers outside the coupling region. Each of the plurality of vias comprises: a pillar portion passing through the stack structure in the first direction; and a plurality of extended portions extending in a radial direction from a side surface of the pillar portion and perpendicular to the first direction, at the same layers as the second dielectric layers.

In an embodiment, a method for manufacturing a semiconductor memory device may include: A method for manufacturing a semiconductor memory device, comprising: alternately stacking a plurality of first dielectric layers and a plurality of second dielectric layers on a first substrate; forming a plurality of vertical holes extending in a first direction perpendicular to a top surface of the first substrate through the alternately stacked first and second dielectric layers; forming a plurality of recesses by removing portions of the second dielectric layers which are adjacent to sidewalls of the vertical holes; defining a coupling region by forming an etch barrier in the vertical holes and the plurality of recesses; removing the second dielectric layers outside the coupling region; and forming electrode layers outside the coupling region in spaces from which the second dielectric layers are removed.

BRIEF DESCRIPTION OF THE DRAWINGS

FIGS. 14A to 19A are representations of top views to assist in the explanation of a method for manufacturing a semiconductor memory device in accordance with an embodiment of the disclosure, according to a manufacturing sequence.

FIGS. 14B to 19B are cross-sectional views taken along the lines D-D' of FIGS. 14A to 19A.

FIGS. 14C to 19C are cross-sectional views taken along the lines E-E' of FIGS. 14A to 19A.

DETAILED DESCRIPTION

Figure 1:
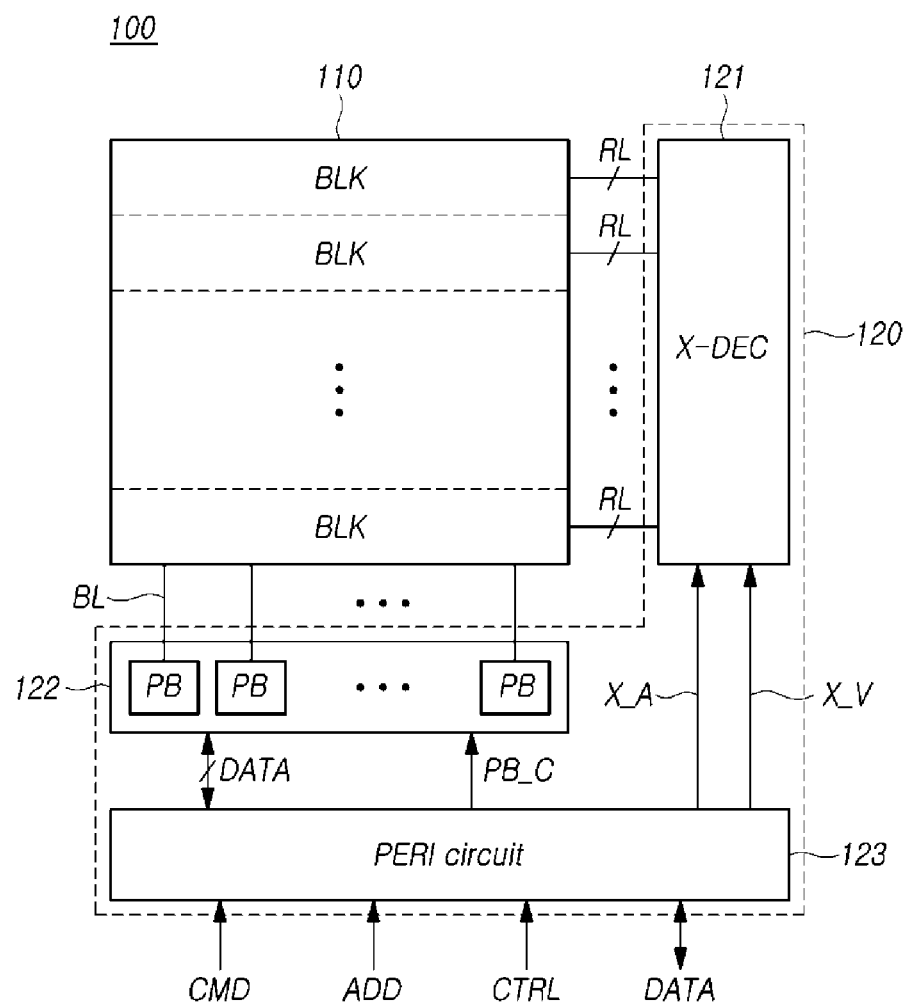
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122, and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor which are coupled in series. Each memory cell may be a volatile memory cell or a nonvolatile memory cell. While some embodiments of the disclosure describe semiconductor memory devices that are NAND flash devices, it is to be understood that the technical spirit of the disclosure is not limited thereto and other volatile or nonvolatile memory devices are contemplated by the disclosure.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write or read data in or from a memory cell that is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines and the arrangement direction of bit lines. The second direction SD may correspond to the extending direction of bit lines and the arrangement direction of word lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Figure 2:
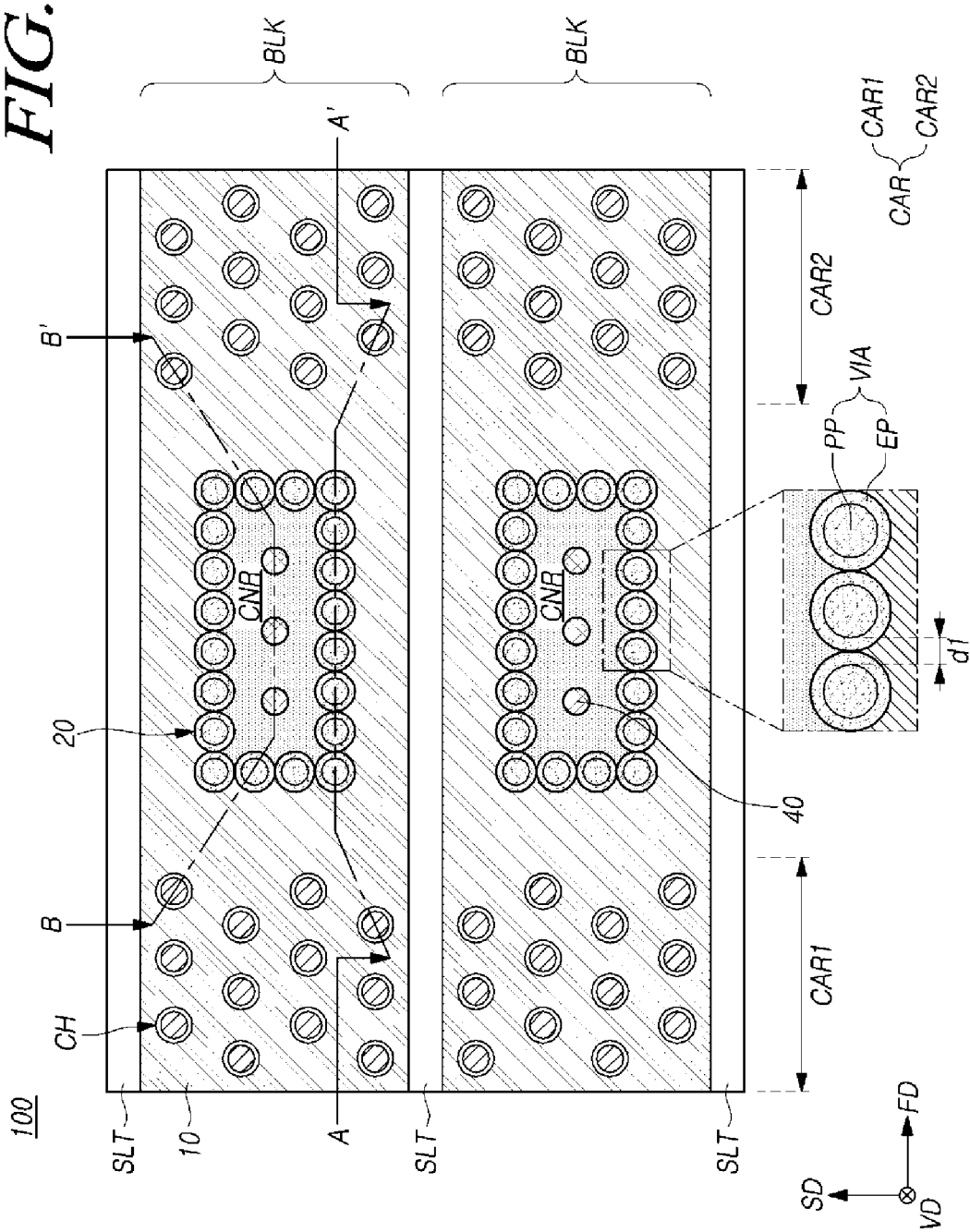
FIG. 2 is a top view illustrating a representation of a semiconductor memory device in accordance with an embodiment of the disclosure.
Figure 3:
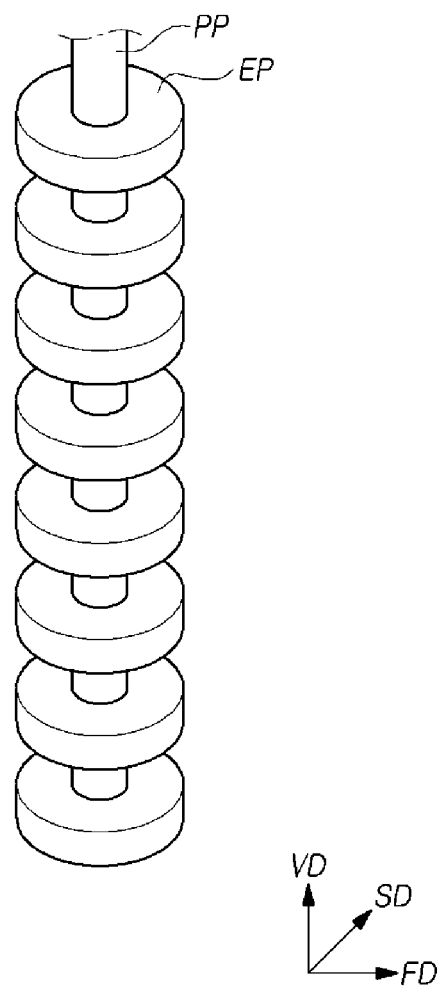
FIG. 3 is a perspective view illustrating a representation of a via illustrated in FIG. 2.
Figure 4:
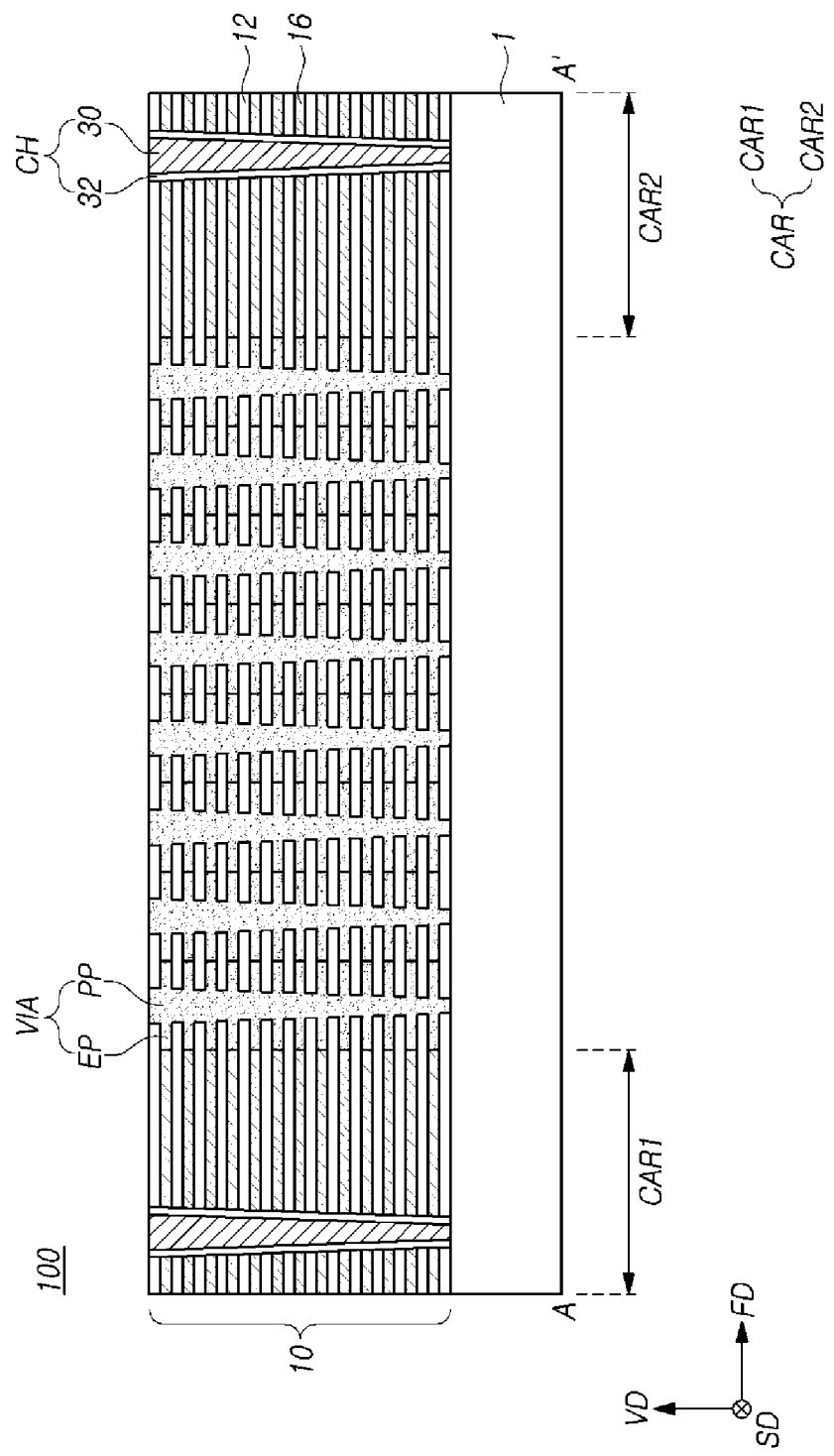
FIG. 4 is a cross-sectional view taken along the line A-A' of FIG. 2.
Figure 5:
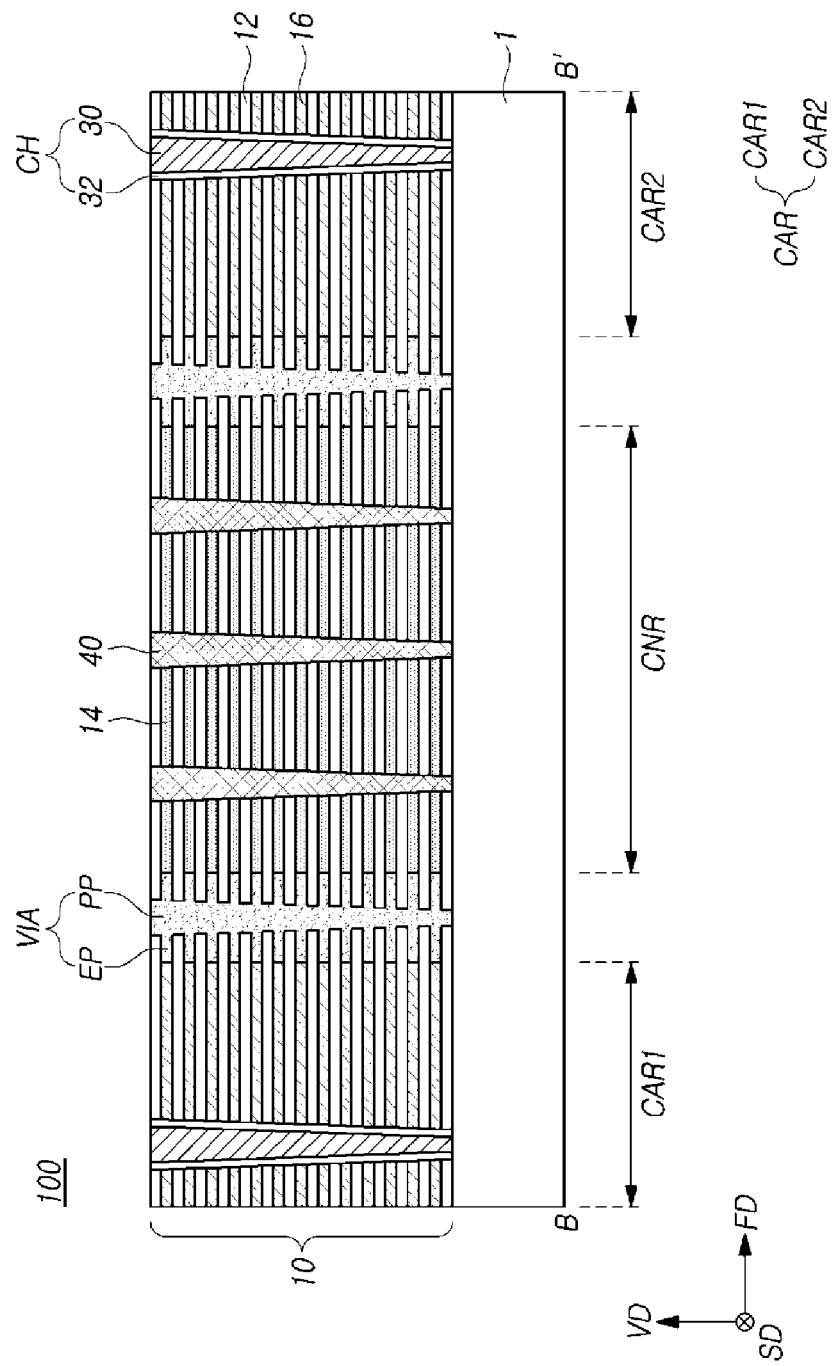
FIG. 5 is a cross-sectional view taken along the line B-B' of FIG. 2.

FIG. 2 is a top view illustrating a representation of a semiconductor memory device in accordance with an embodiment of the disclosure. FIG. 3 is a perspective view illustrating a representation of a via VIA illustrated in FIG. 2. FIG. 4 is a cross-sectional view taken along the line A-A' of FIG. 2, and FIG. 5 is a cross-sectional view taken along the line B-B' of FIG. 2.

Referring to FIG. 2, a semiconductor memory device 100 may include a cell region CAR and a coupling region CNR. The cell region CAR may include a first cell region CAR1 and a second cell region CAR2, which are disposed relative to each other in the first direction FD. The coupling region CNR may be disposed between the first cell region CAR1 and the second cell region CAR2.

A plurality of memory blocks BLK may be arranged in the second direction SD. Each of the memory blocks BLK may be disposed over the first and second cell regions CAR1 and CAR2 and the coupling region CNR. Each memory block BLK may include a stack structure 10, which is disposed on a first substrate 1 (see FIGS. 4 and 5). The stack structure 10 may be disposed over the first and second cell regions CAR1 and CAR2 and the coupling region CNR.

A plurality of channel structures CH, which pass through the stack structure 10 in the vertical direction VD, may be defined in the first and second cell regions CAR1 and CAR2. The channel structures CH may be arranged or spaced apart in the first direction FD and in the second direction SD.

The stack structures 10 of the memory blocks BLK may be separated from one another by slits SLT. Each slit SLT may be defined as an interval or a distance between adjacent memory blocks BLK, and may be substantially parallel to a plane defined by the first direction FD and the vertical direction VD. The memory blocks BLK and the slits SLT may extend in the first direction FD. Although the present embodiment illustrates a case where the slits SLT divide the stack structures 10 and the channel structures CH into memory block units, it is to be noted that the disclosure is not limited thereto. The slits SLT may divide the stack structures 10 and the channel structures CH into units smaller than memory blocks, such as for example, memory finger units. While not illustrated, a common source line may be disposed in the slit SLT.

A plurality of vias VIA, which pass through the stack structure 10 in the vertical direction VD, may be defined at the edges of the coupling region CNR. The plurality of vias VIA may configure an etch barrier 20. The coupling region CNR may be defined by the vias VIA which configure the etch barrier 20. The vias VIA may be disposed at all the edges and along the entire boundary of the coupling region CNR. For example, the coupling region CNR may be surrounded by the vias VIA in a plan or top view.

Referring to FIG. 3, each via VIA may include a pillar portion PP and a plurality of extended portions EP. The pillar portion PP may extend in the vertical direction VD. The extended portions EP may extend, in a direction parallel to a plane defined by the first direction FD and the second direction SD, outward from the outer circumference of the pillar portion PP. The extended portions EP may be disposed to be spaced apart from one another in a lengthwise direction of the pillar portion PP, i.e., in the vertical direction VD.

Referring back to FIG. 2, the pillar portions PP of adjacent vias VIA may be spaced apart from each other by a first interval d1. The extended portions EP of adjacent vias VIA may be brought into contact with each other. Contact plugs 40, which pass through the stack structure 10, may be defined in the coupling region CNR.

Referring to FIGS. 4 and 5, the stack structure 10 may be disposed on the first substrate 1. Within the coupling region CNR, the stack structure 10 may have a structure in which first dielectric layers 12 and second dielectric layers 14 are alternately stacked in the vertical direction VD. The first dielectric layers 12 and the second dielectric layers 14 may be formed of different materials. For example, the first dielectric layers 12 may be formed with a dielectric material for interlayer insulation. The second dielectric layers 14 may be formed of a dielectric material suitable for use in sacrificial layers and having an etching selectivity with respect to the first dielectric layers 12. For example, the first dielectric layers 12 may be formed of silicon oxide, and the second dielectric layers 14 may be formed of silicon nitride.

Outside the coupling region CNR, such as in first and second cell regions CAR1 and CAR2, the stack structure 10 may have a structure in which the first dielectric layers 12 and electrode layers 16 are alternately stacked in the vertical direction VD. The electrode layers 16 may include a conductive material. For example, the electrode layers 16 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum), as non-limiting examples.

The electrode layers 16 may configure the row lines RL described above with reference to FIG. 1. Among the electrode layers 16, at least one layer from the lowermost layer may configure a source select line, and at least one layer from the uppermost layer may configure a drain select line. The electrode layers 16 between the source select line and the drain select line may configure word lines.

Each channel structure CH in the cell region CAR may pass through the stack structure 10 in the vertical direction VD. The bottom end of the channel structure CH may be coupled to the first substrate 1. The channel structure CH may include a channel layer 30 and a gate dielectric layer 32. The channel layer 30 may include polysilicon or monocrystalline silicon, and may include a P-type impurity such as boron (B) in some regions thereof. The channel layer 30 may have the shape of a pillar which is completely filled up to the central region thereof or a solid cylinder. While not illustrated, the channel layer 30 may have the shape of a tube whose central region is open. In this case, a buried dielectric layer may be formed in the open central region of the channel layer 30. Furthermore, the channel layer 30 may taper, or reduce in cross-sectional area, from a larger top end to a smaller or narrower bottom end. The gate dielectric layer 32 may have the shape of a straw or a cylindrical shell which surrounds the outer wall of the channel layer 30. While not illustrated, the gate dielectric layer 32 may include a tunnel dielectric layer, a charge storage layer and a blocking layer which are sequentially stacked from the outer wall of the channel layer 30. In some embodiments, the gate dielectric layer 32 may have an ONO (oxide-nitride-oxide) stack structure in which an oxide layer, a nitride layer and an oxide layer are sequentially stacked. Source select transistors, memory cells and drain select transistors may be formed in areas or regions where the electrode layers 16 surround the channel structures CH.

The pillar portion PP of the via VIA may pass through the stack structure 10 in the vertical direction VD, and the bottom end of the pillar portion PP may be coupled to the first substrate 1. The plurality of the extended portions EP of the via VIA may be disposed at the same layers, or in the same vertical locations, as the second dielectric layers 14.

The vias VIA may be formed of a material which has an etching selectivity with respect to the second dielectric layers 14. The vias VIA may include a dielectric material. For example, the vias VIA may include silicon oxide. The vias VIA may include a conductive material. For example, the vias VIA may include at least one selected from among a metal, a metal oxide and a semiconductor. The pillar portion PP and the plurality of the extended portions EP may be made of the same material. The pillar portion PP may have a cylindrical shape which is filled up to the central region thereof with a single material. Furthermore, the pillar portion PP may taper, or reduce in cross-sectional area, from a larger top end to a smaller or narrower bottom end.

As will be described later with reference to FIGS. 17A to 18C, after the slits SLT are formed through the first dielectric layers 12 and the second dielectric layers 14, by injecting, through the slits SLT, an etching material capable of removing the second dielectric layers 14, the second dielectric layers 14 in the cell region CAR may be removed. The vias VIA may play the role of preventing the etching material from penetrating into the coupling region CNR in the etching process for removing the second dielectric layers 14.

The contact plugs 40 in the coupling region CNR may pass through the first dielectric layers 12 and the second dielectric layers 14 in the vertical direction VD. The contact plugs 40 may be made of a conductive material, for example, tungsten (W) or copper (Cu). Furthermore, the contact plugs 40 may taper, or reduce in cross-sectional area, from a larger top end to a smaller or narrower bottom end. While the present embodiment illustrates contact plugs 40 that pass through only the first dielectric layers 12 and the second dielectric layers 14, it is to be noted that the disclosure is not limited thereto. These structures will be apparent through the embodiments described below with reference to FIGS. 12 and 13.

Figure 6:
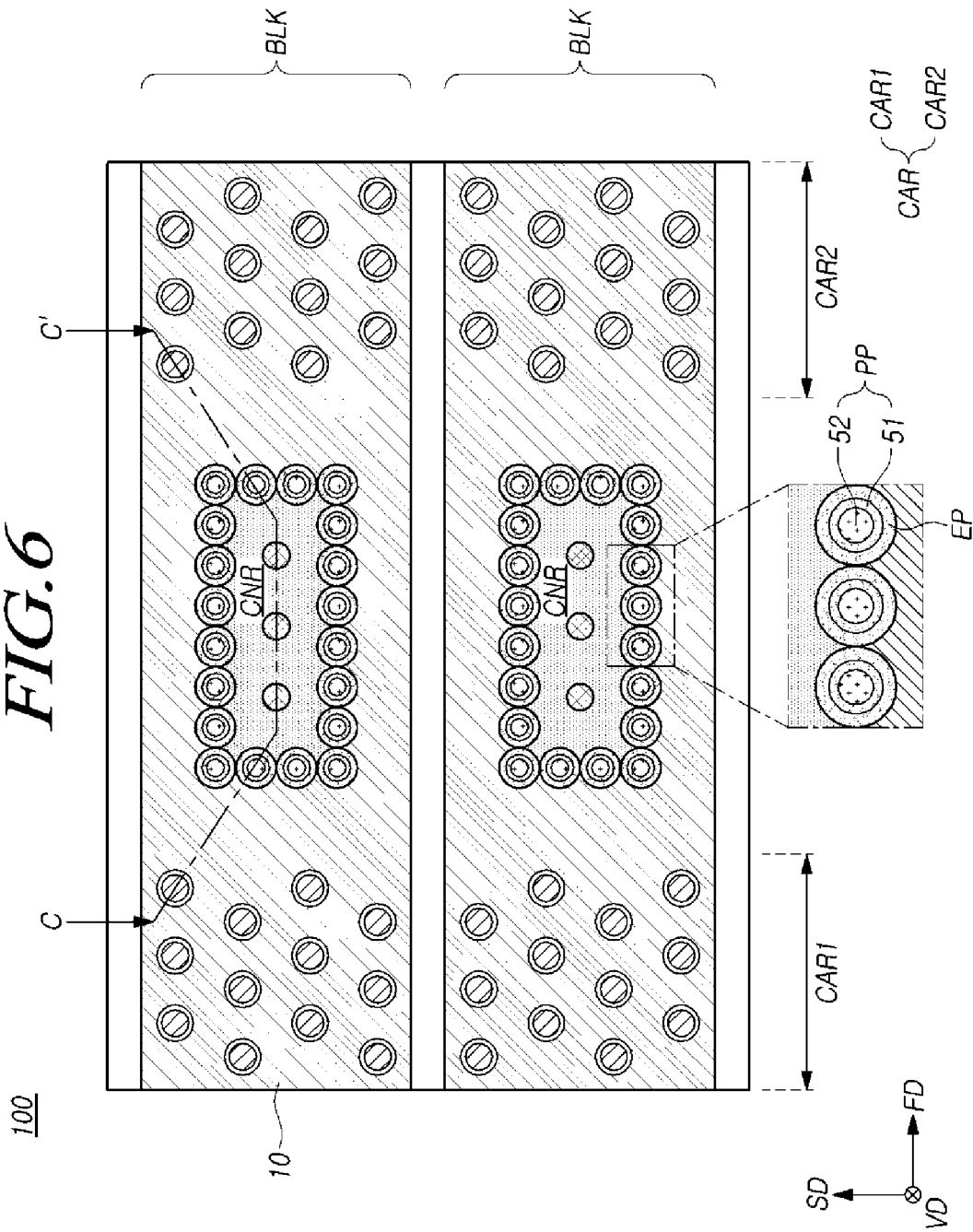
FIG. 6 is a top view illustrating a representation of a semiconductor memory device in accordance with an embodiment of the disclosure.
Figure 7:
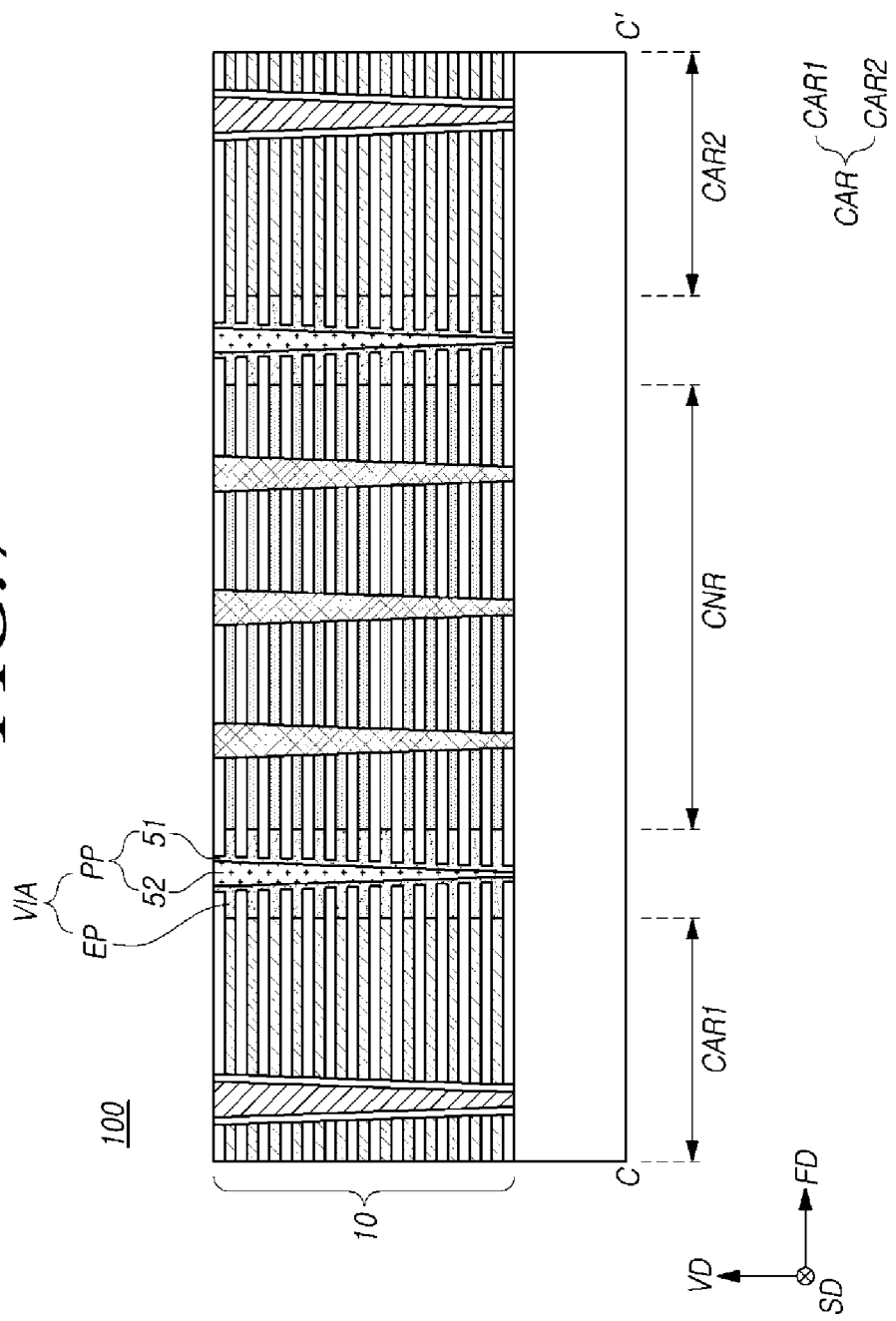
FIG. 7 is a cross-sectional view taken along the line C-C' of FIG. 6.

FIG. 6 is a top view illustrating a representation of a semiconductor memory device in accordance with an embodiment of the disclosure, and FIG. 7 is a cross-sectional view taken along the line C-C' of FIG. 6.

Referring to FIGS. 6 and 7, the pillar portion PP may include a first layer 51 and a second layer 52. The first layer 51 may configure the sidewall of the pillar portion PP, which is brought into contact with the extended portions EP. The first layer 51 may have the shape of a tube, a straw or a cylindrical shell whose central region is open. The first layer 51 may be made of the same material as the extended portions EP. The second layer 52 may be disposed in the open central region of the first layer 51. The second layer 52 may be made of a material different from that of the first layer 51. The first layer 51 may be made of a dielectric material, for example, silicon oxide, and the second layer 52 may be made of a conductive material, for example, tungsten (W) or copper (Cu). Conversely, the first layer 51 may be made of a conductive material, for example, tungsten (W) or copper (Cu), and the second layer 52 may be made of a dielectric material, for example silicon oxide. Furthermore, the first layer 51 and the second layer 52 may taper in the vertical direction VD, or reduce in cross-sectional area, from a larger top end to a smaller or narrower bottom end.

Figure 8:
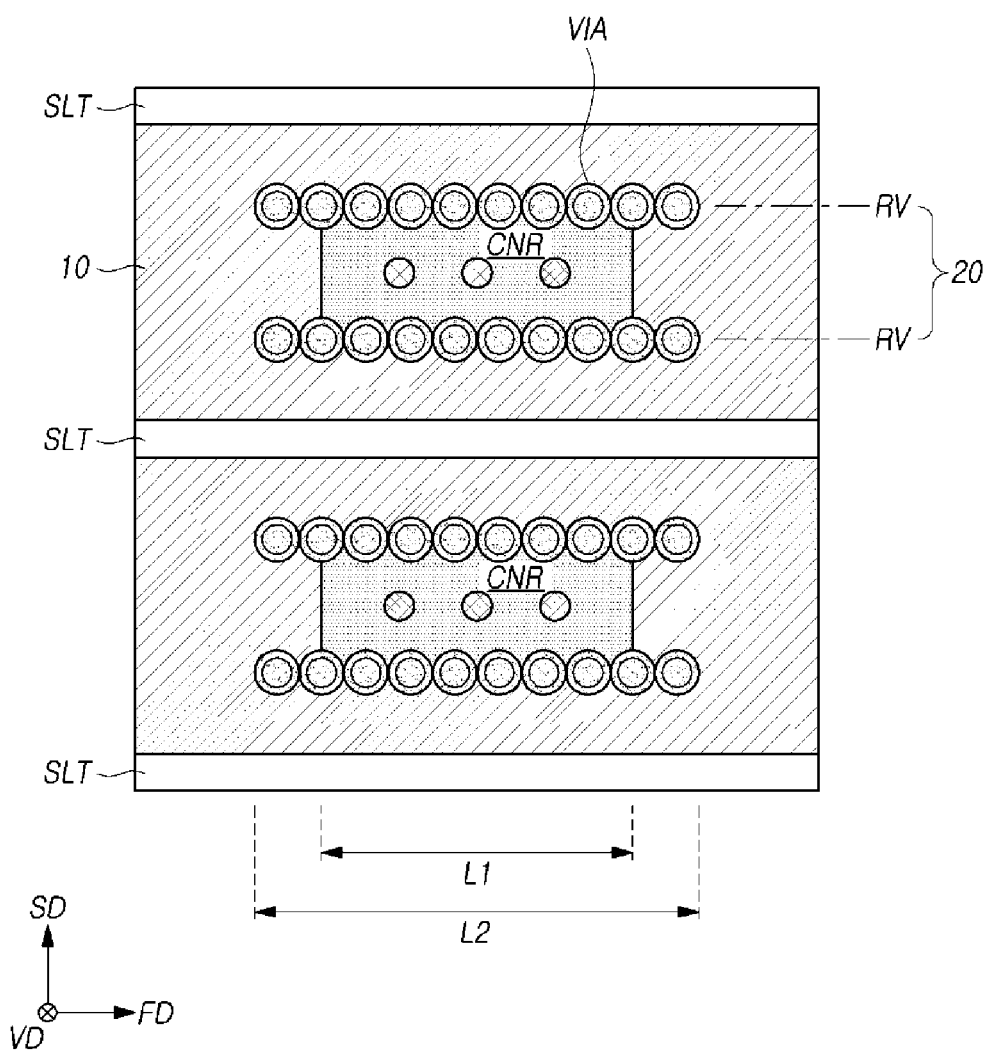
FIGS. 8 to 11 are top views illustrating representations of semiconductor memory devices in accordance with embodiments of the disclosure.

FIG. 8 is a top view illustrating a representation of a semiconductor memory device in accordance with an embodiment of the disclosure.

Referring to FIG. 8, the etch barrier 20 may include a pair of via rows RV, which are disposed between adjacent slits SLT. The via rows RV may be arranged in the second direction SD, which is also the arrangement direction of the slits SLT. Each of the via rows RV may include a plurality of vias VIA that are arranged in the first direction FD, which is also the extending direction of the slits SLT. The plurality of vias VIA that configure the etch barrier 20 may be disposed at the edges of the coupling region CNR that are parallel or substantially parallel to the slits SLT. The etch barrier 20 may have a structure in which the other ends in the first direction FD are open, and do not have vias VIA disposed and the open-ended edges.

In the first direction FD, both open-ended edges of the coupling region CNR may be offset towards the center of the coupling region CNR from the ends of the via rows RV. The coupling region CNR may have a first length L1 in the first direction FD. The via rows RV may have a second length L2 in the first direction, and the second length L2 may be longer than the first length L1. The via rows RV may overlap the coupling region CNR in the second direction SD. The difference between the first length L1 and the second length L2 may be understood as a length or distance by which an etching material penetrates through both the open ends of the etch barrier 20 in an etching process for removing the second dielectric layers 14 of the cell region CAR, which will be described later with reference to FIGS. 18A to 18C.

Figure 9:
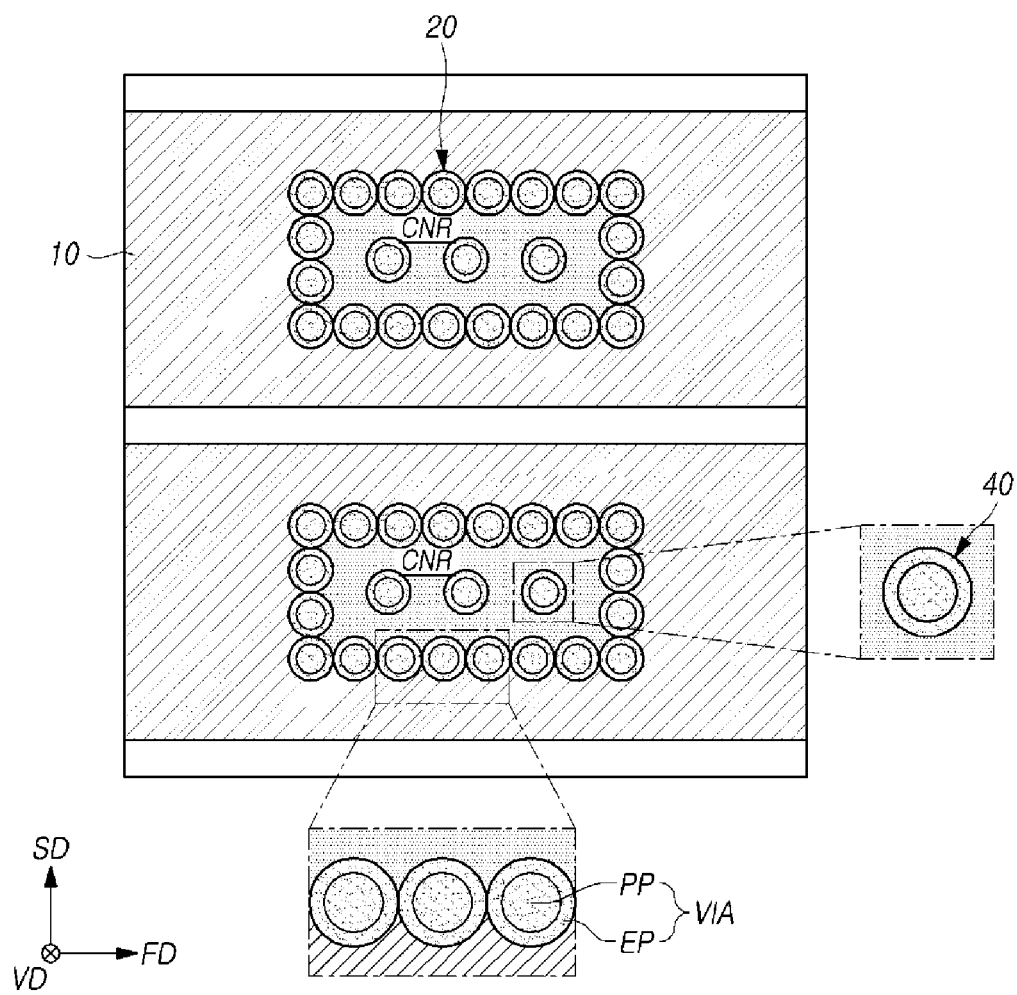
Figure 10:
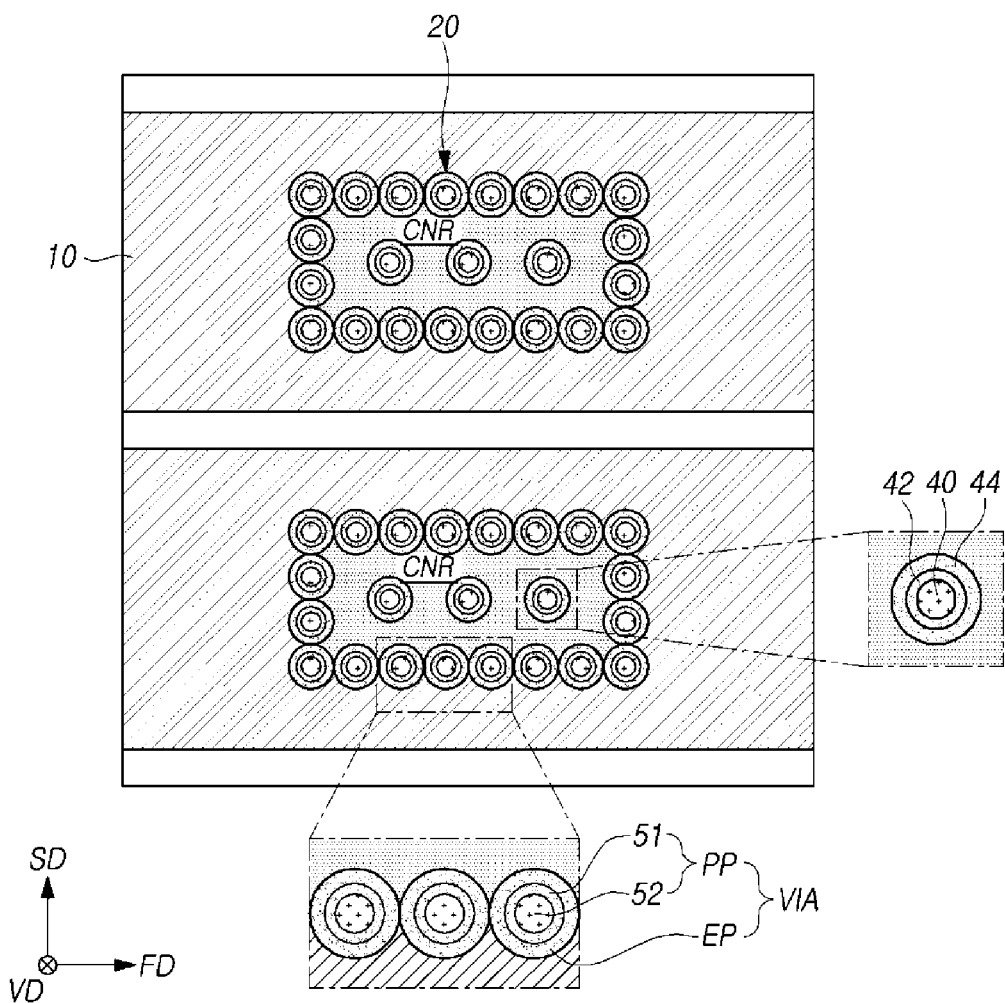
Figure 11:
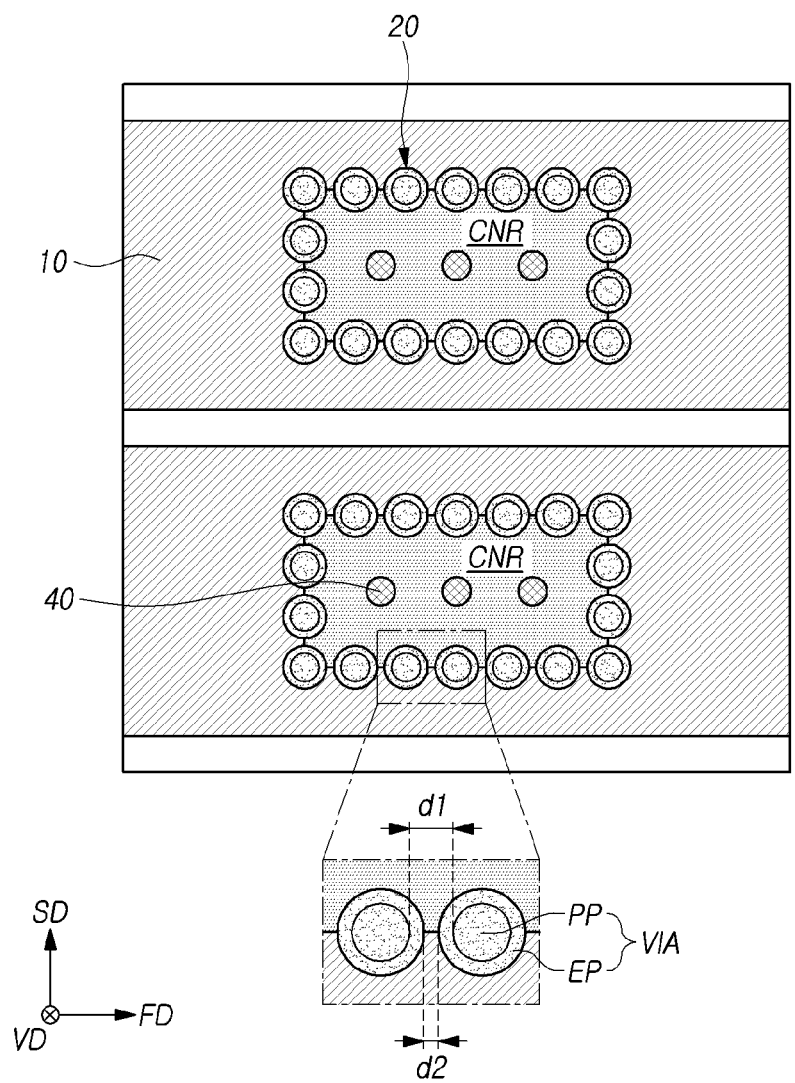

FIGS. 9 to 11 are top views illustrating representations of semiconductor memory devices in accordance with embodiments of the disclosure.

Referring to FIG. 9, the contact plugs 40 may be formed in the same process step, and be made of the same material, as the vias VIA. The vias VIA and the contact plugs 40 may be made of a conductive material, for example, tungsten (W) or copper (Cu).

Referring to FIG. 10, the pillar portion PP of each via VIA may include a first layer 51 and a second layer 52. The first layer 51 may configure the sidewall of the pillar portion PP, which is brought into contact with the extended portions EP. The first layer 51 may have the shape of a tube, a straw or a cylindrical shell whose central region is open. The first layer 51 may be made of a dielectric material, for example, silicon oxide, and the second layer 52 may be made of a conductive material, for example, tungsten (W) or copper (Cu). The contact plugs 40 may be formed at the same process step and be made of the same material as the second layer 52. A dielectric sidewall 42 may be defined on the outer wall of each contact plug 40. The dielectric sidewall 42 may have the shape of a straw or a cylindrical shell which surrounds the outer wall of the contact plug 40. The dielectric sidewall 42 may be formed at the same process step and be made of the same material as the first layer 51. A plurality of extended portions 44, similar to extended portions EP of the via VIA, may be defined on the outer wall of the dielectric sidewall 42. The extended portions 44 may be disposed to be spaced apart from one another in the vertical direction VD. The extended portions 44 may be formed at the same process step and be made of the same material as the extended portions EP of the via VIA.

Referring to FIG. 11, the pillar portions PP of adjacent vias VIA may be spaced apart from each other by a first interval d1. The extended portions EP of adjacent vias VIA may be spaced apart from each other by a second interval d2, which is smaller than the first interval d1. The second interval d2 may be selected or sized to suppress or prevent the penetration of the etching material into the coupling region CNR during the etching process for removing the second dielectric layers 14 of the cell region CAR, which will be described later with reference to FIGS. 18A to 18C.

Figure 12:
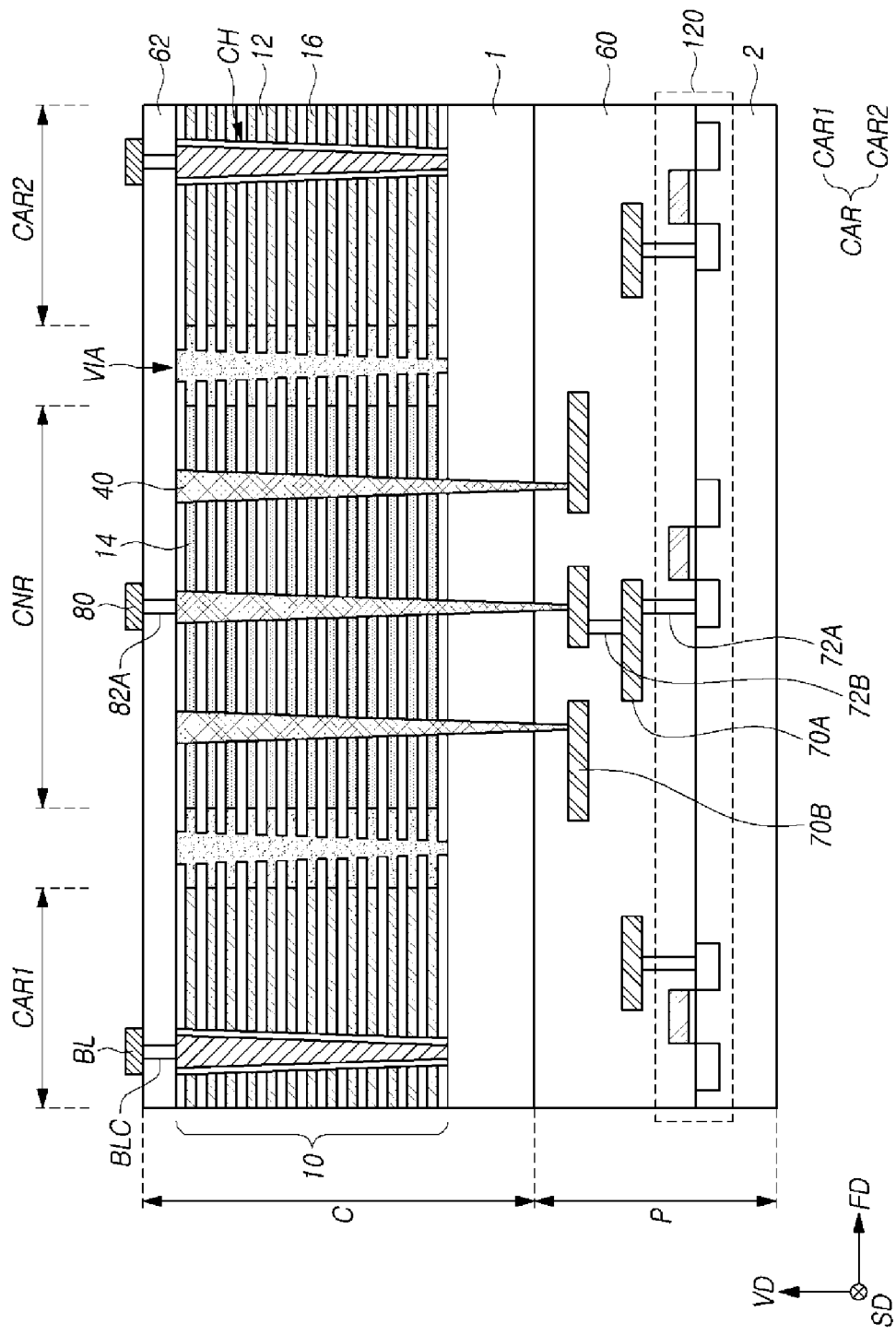
FIGS. 12 and 13 are cross-sectional views illustrating representations of semiconductor memory devices in accordance with embodiments of the disclosure.

FIG. 12 is a cross-sectional view illustrating a representation of a semiconductor memory device in accordance with an embodiment of the disclosure.

Referring to FIG. 12, a semiconductor memory device may have a PUC (peri under cell) structure. A logic structure P may be disposed under a memory structure C. The logic structure P may include a second substrate 2 and a logic circuit 120, which is disposed on the second substrate 2. The second substrate 2 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The logic circuit 120 may include the row decoder 121, the page buffer circuit 122 and the peripheral circuit 123 of FIG. 1.

An interlayer dielectric layer 60 may be defined on the second substrate 2 to cover the logic circuit 120. Wiring lines 70B may be disposed in the interlayer dielectric layer 60. The wiring lines 70B may be coupled to the logic circuit 120 through contacts 72A and 72B and wiring lines 70A.

The memory structure C may be disposed on the interlayer dielectric layer 60. The memory structure C may include the stack structure 10, the vias VIA and the channel structures CH described above with reference to FIGS. 2 to 11. Contact plugs 40 may be coupled to the wiring lines 70B in a coupling region CNR by passing through first and second dielectric layers 12 and 14, which are alternately stacked; a first substrate 1; and the interlayer dielectric layer 60.

An interlayer dielectric layer 62 may be defined on the stack structure 10 to cover the stack structure 10, the vias VIA, the channel structures CH and the contact plugs 40. Bit lines BL may be defined on the interlayer dielectric layer 62 in a cell region CAR. The bit lines BL may extend in the second direction SD, and may be arranged in the first direction FD. Bit line contacts BLC, which pass through the interlayer dielectric layer 62, may be defined under the bit lines BL to couple the bit lines BL and the channel structures CH with each other. A wiring line 80 may be defined on the interlayer dielectric layer 62. A contact 82A which passes through the interlayer dielectric layer 62 may be defined under the wiring line 80 to couple the wiring line 80 and the contact plug 40. The contact plug 40 may provide an electrical path that couples the wiring line 80, disposed over the stack structure 10, and the wiring line 70B disposed below the stack structure 10.

Figure 13:
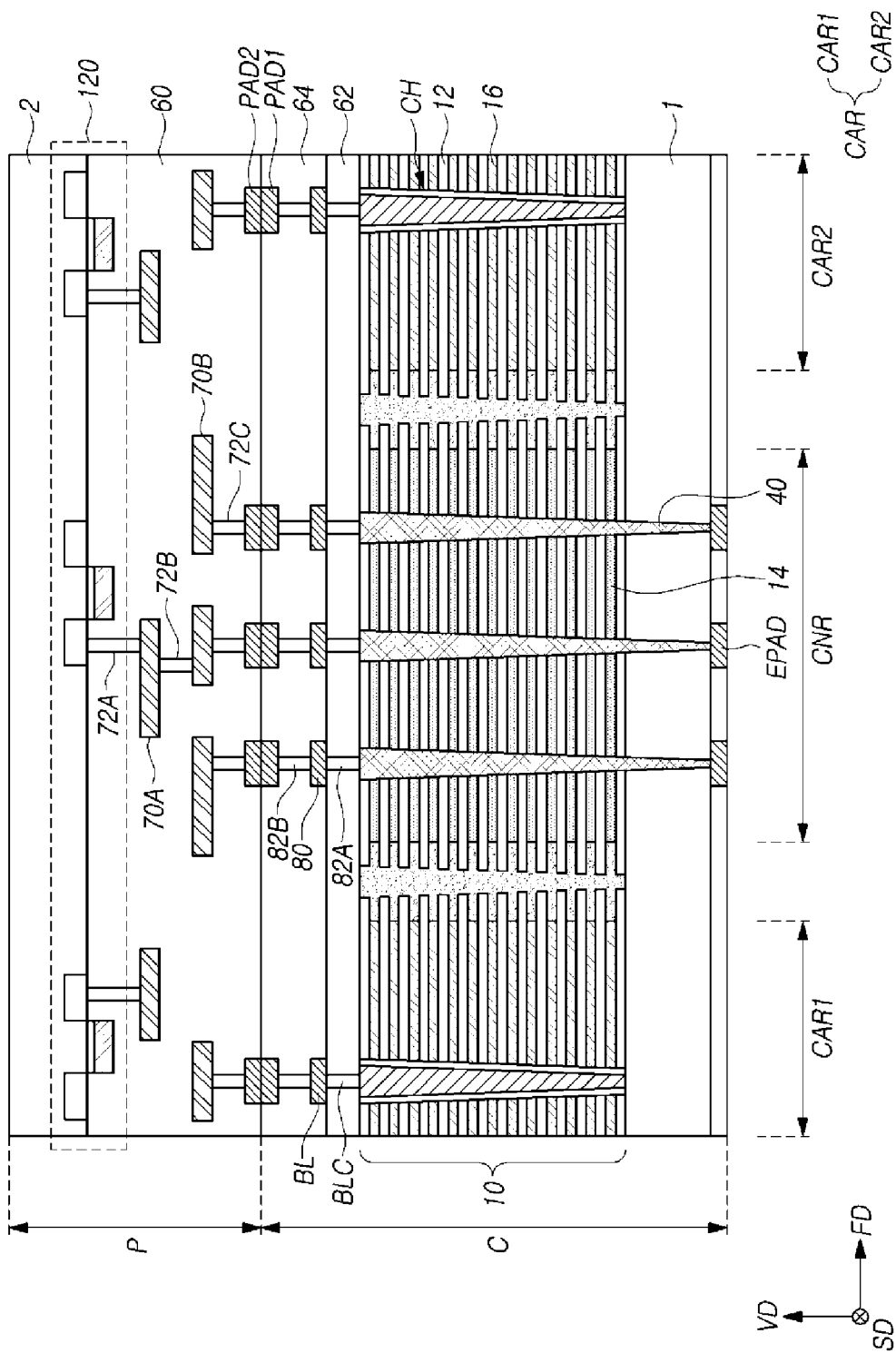

FIG. 13 is a cross-sectional view illustrating a representation of a semiconductor memory device in accordance with an embodiment of the disclosure.

Referring to FIG. 13, a semiconductor memory device may have a POC (peri over cell) structure. A logic structure P may be disposed over a memory structure C. The memory structure C and the logic structure P may be separately fabricated and then bonded to each other. The memory structure C may be fabricated on a first substrate 1. The logic structure P may be fabricated on a second substrate 2. The first substrate 1 and the second substrate 2 may be made of the same material. Each of the first substrate 1 and the second substrate 2 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

External pads EPAD may be disposed on the bottom surface of the first substrate 1. Contact plugs 40 may be coupled to the external pads EPAD in a coupling region CNR by passing through first and second dielectric layers 12 and 14, which are alternately stacked, and the first substrate 1.

Wiring lines 80 may be defined on an interlayer dielectric layer 62. Contacts 82A, which pass through the interlayer dielectric layer 62, may be defined under the wiring lines 80 to couple the wiring lines 80 and the contact plugs 40. An interlayer dielectric layer 64 may be defined on the interlayer dielectric layer 62 to cover bit lines BL and the wiring lines 80. The top surface of the interlayer dielectric layer 64 may configure one surface of the memory structure C, which is to be bonded with the logic structure P. First pads PAD1, which are coupled to the bit lines BL and the wiring lines 80 through contacts 82B, may be defined in or common to the top surface of the interlayer dielectric layer 64.

Second pads PAD2, which are coupled to a logic circuit 120 through wiring lines 70A and 70B and contacts 72A, 72B and 72C, may be defined on or common to one surface of the logic structure P, which is bonded with the memory structure C.

As the one surface of the memory structure C and the one surface of the logic structure P are bonded to each other, the first pads PAD1 of the memory structure C and the second pads PAD2 of the logic structure P may be coupled with each other. Accordingly, electrical paths that couple the memory cells of the memory structure C and the logic circuit 120 of the logic structure P may be provided.

Hereafter, a method for manufacturing a semiconductor memory device in accordance with an embodiment of the disclosure will be described.

FIGS. 14A to 19A are representations of top views to assist in the explanation of a method for manufacturing a semiconductor memory device in accordance with an embodiment of the disclosure, according to a manufacturing sequence. FIGS. 14B to 19B are cross-sectional views taken along the lines D-D' of FIGS. 14A to 19A, and FIGS. 14C to 19C are cross-sectional views taken along the lines E-E' of FIGS. 14A to 19A.

Figure 14A:
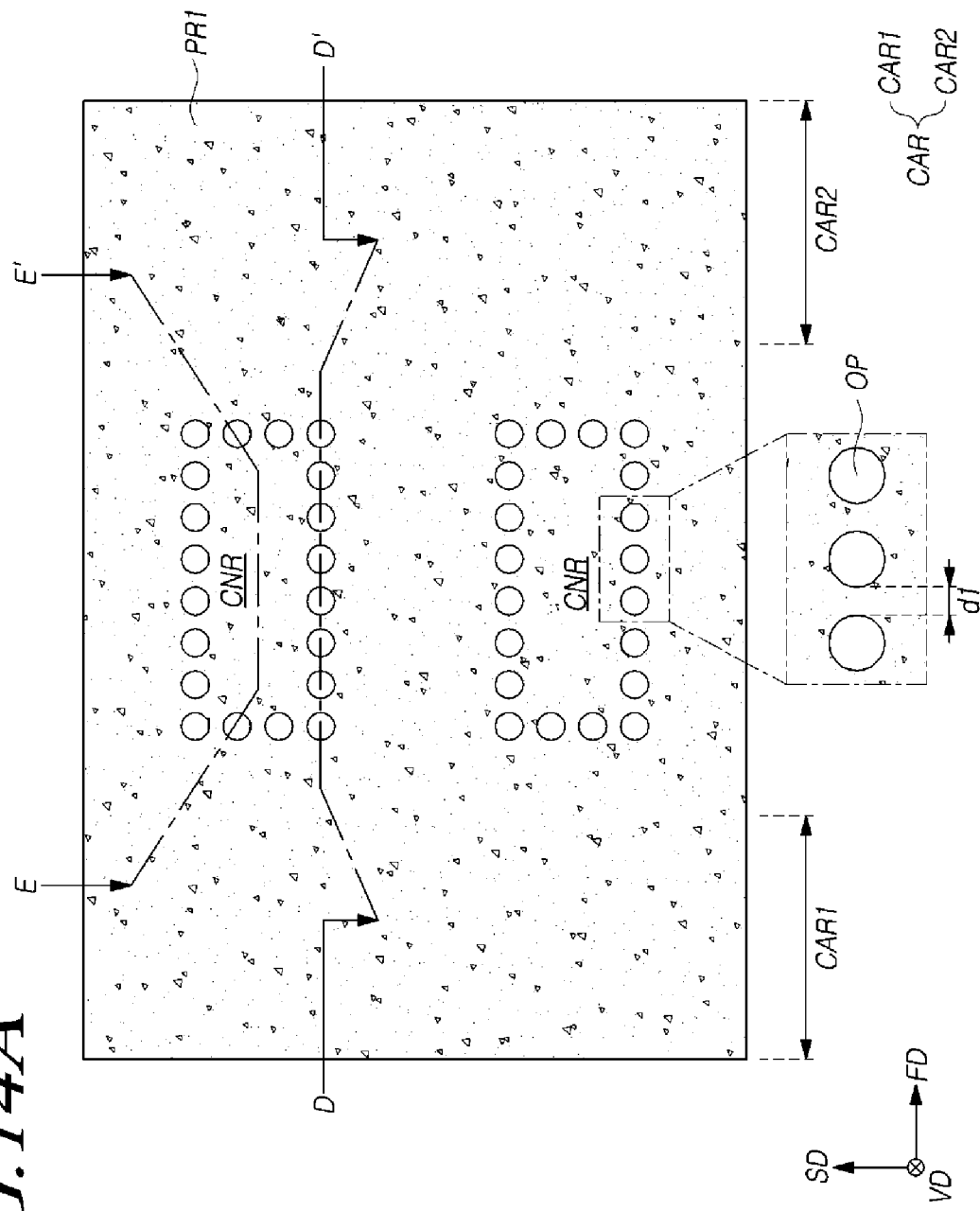

Referring to FIGS. 14A to 14C, first dielectric layers 12 and second dielectric layers 14 may be alternately stacked on a first substrate 1 which is defined with a cell region CAR. The cell region CAR may include a first cell region CAR1 and a second cell region CAR2, which are disposed to be spaced apart from each other in the first direction FD.

The first dielectric layers 12 and the second dielectric layers 14 may be formed of different materials. For example, the first dielectric layers 12 may be formed of a dielectric material for interlayer insulation, and the second dielectric layers 14 may be formed of a dielectric material suitable for use as sacrificial layers and having an etching selectivity with respect to the first dielectric layers 12. For example, the first dielectric layers 12 may be formed as silicon oxide layers, and the second dielectric layers 14 may be formed as silicon nitride layers.

A mask pattern PR1, which has a plurality of opening holes OP spaced apart from one another with a first interval d1, may be formed on the first and second dielectric layers 12 and 14, which are alternately stacked. By etching through the stacked first and second dielectric layers 12 and 14 in an etching process using the mask pattern PR1 as an etch mask, a plurality of vertical holes VH may be formed. The plurality of vertical holes VH may define a coupling region CNR. The coupling region CNR may be disposed between the first cell region CAR1 and the second cell region CAR2. The mask pattern PR1 may be formed of a photoresist, and may be removed after the vertical holes VH are formed.

Figure 15C:
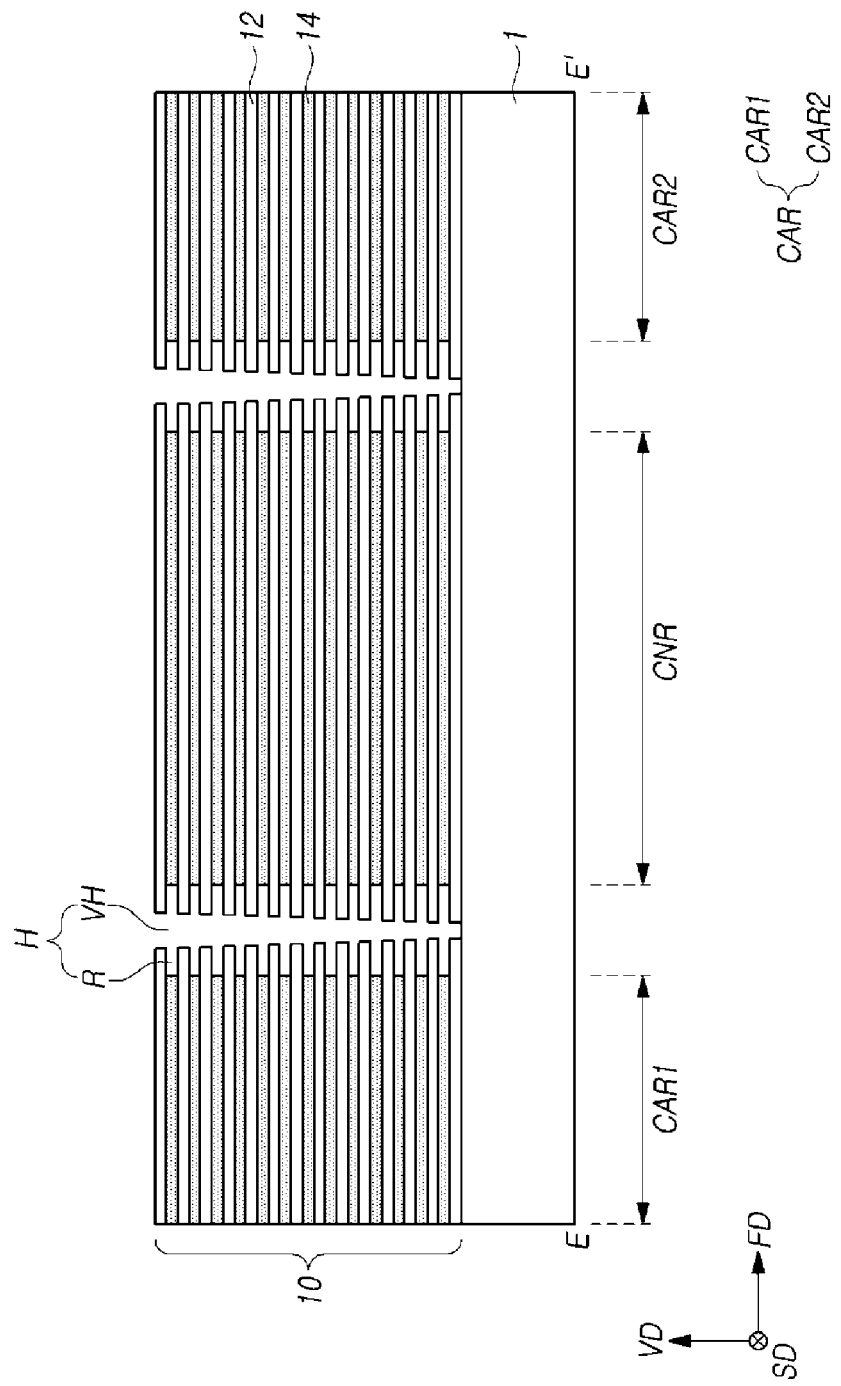

Referring to FIGS. 15A to 15C, recesses R may be formed as the second dielectric layers 14, which are adjacent to the sidewalls of the vertical holes VH, are etched. The process of forming the recesses R may be performed in such a way to include injecting an etching material (e.g., an etchant capable of removing the second dielectric layers 14) into the vertical holes VH. The recesses R may extend from the sidewalls of the vertical holes VH in a direction parallel to a plane defined by the first direction FD and the second direction SD. One vertical hole VH and a plurality of recesses R extending therefrom may configure a unit hole H. A plurality of unit holes H may be defined at the edges of the coupling region CNR to configure spaces for forming an etch barrier.

While the present description illustrates an etching process in which the recesses R of adjacent unit holes H, which are positioned at the same layer, are coupled with each other, it is to be noted that the disclosure is not limited thereto. For instance, the etching process may be performed such that the recesses R of adjacent unit holes H, which are positioned at the same layer, are not coupled with each other. In such instances, the second dielectric layers 14 may remain between the recesses R of adjacent unit holes H.

While the present description illustrates unit holes H disposed at each of the edges of the coupling region CNR, it is to be noted that the disclosure is not limited thereto. For instance, the unit holes H may be disposed only at both ends or edges of the coupling region CNR which face each other in the second direction SD, and not disposed at the ends of the coupling region CNR that face each other in the first direction FD.

Figure 16A:
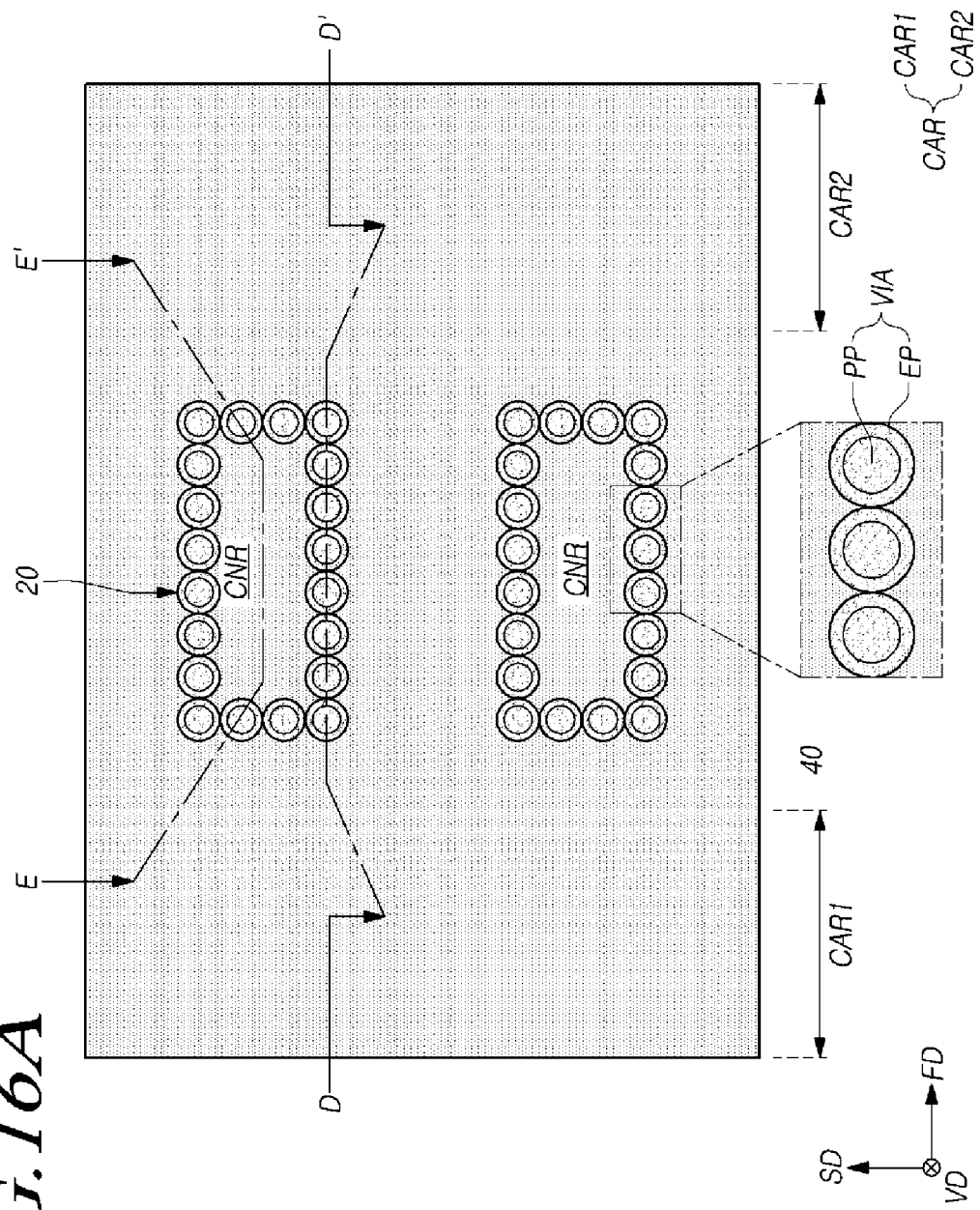

Referring to FIGS. 16A to 16C, as a material which has an etching selectivity with respect to the second dielectric layers 14 is filled in the unit holes H, vias VIA may be formed. The vias VIA may include a dielectric material. For example, the vias VIA may include silicon oxide. The vias VIA may include a conductive material. For example, the vias VIA may include at least one selected among a metal, a metal oxide and a semiconductor.

Each via VIA may include a pillar portion PP and a plurality of extended portions EP that extend outward from the sidewall of the pillar portion PP. The pillar portion PP that fills the vertical hole VH may extend in the vertical direction VD. The extended portions EP, as portions which fill the recesses R, may extend outward from the sidewall of the pillar portion PP in a direction parallel or substantially parallel to a plane defined by the first direction FD and the second direction SD.

While the present description illustrates an example in which the pillar portion PP is made of the same material as the extended portions EP, and in which the pillar portion PP is filled with a single material in the central region thereof, it is to be noted that the disclosure is not limited thereto. As illustrated in FIGS. 6 and 7, the pillar portion PP may be configured by a first layer which has the shape of a tube, a straw or a cylindrical shell whose central region is open, and a second layer which is disposed in the open central region of the first layer. The first layer may be the same material as the material forming the extended portions EP, and the second layer may be made of a material different from the material of the first layer. The first layer may be made of a dielectric material, for example, silicon oxide, and the second layer may be made of a conductive material, for example, tungsten (W) or copper (Cu).

Figure 17B:
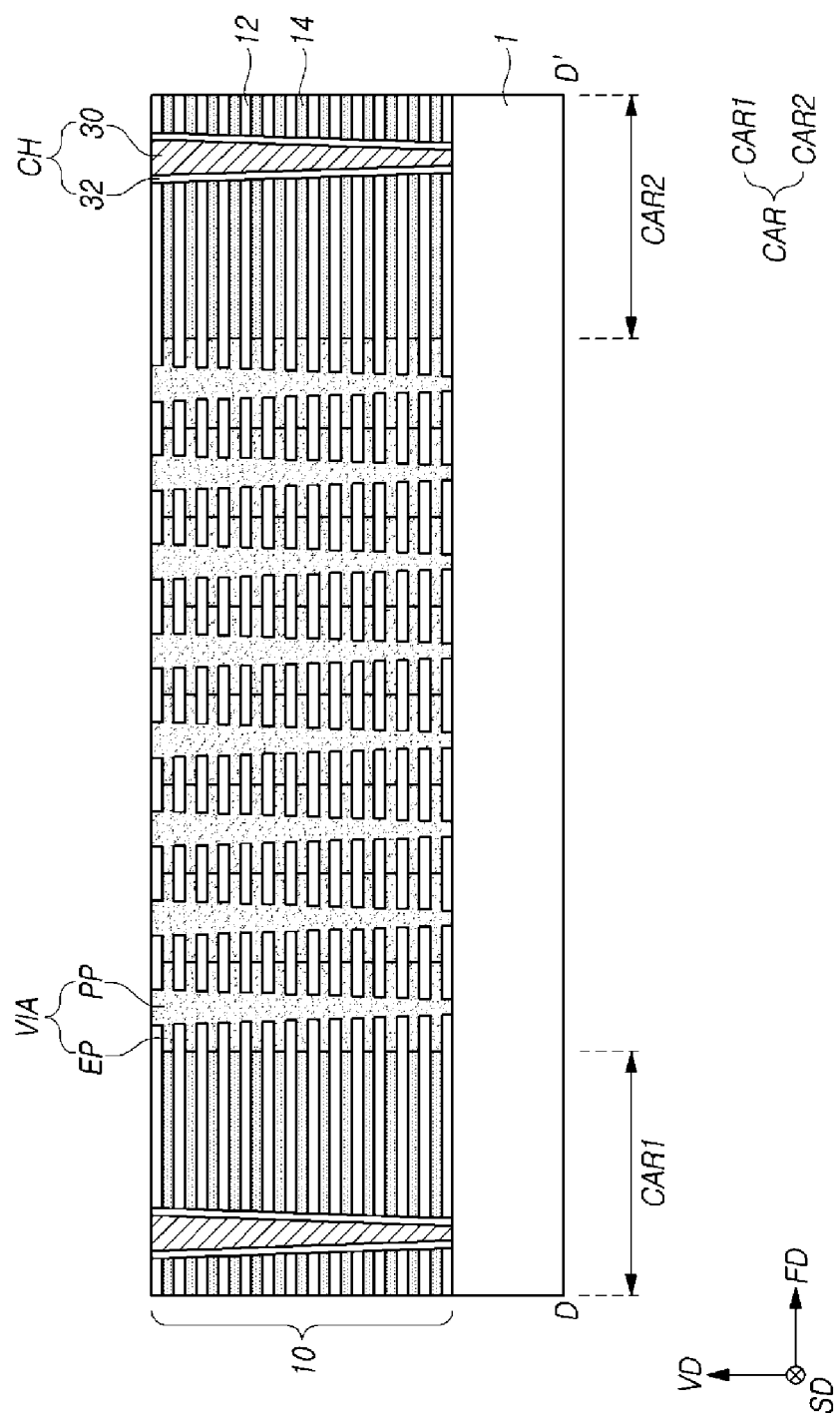

Referring to FIGS. 17A to 17C, a plurality of channel structures CH are formed to pass in the vertical direction VD through the first and second dielectric layers 12 and 14 in the cell region CAR. The channel structures CH may be formed by forming a plurality of channel holes, which pass through the first and second dielectric layers 12 and 14, and sequentially forming a gate dielectric layer 32 and a channel layer 30 in the channel holes.

A plurality of slits SLT that divide the first and second dielectric layers 12 and 14 alternately stacked may be formed. The slits SLT may extend in the first direction FD and be arranged in the second direction SD.

Figure 18B:
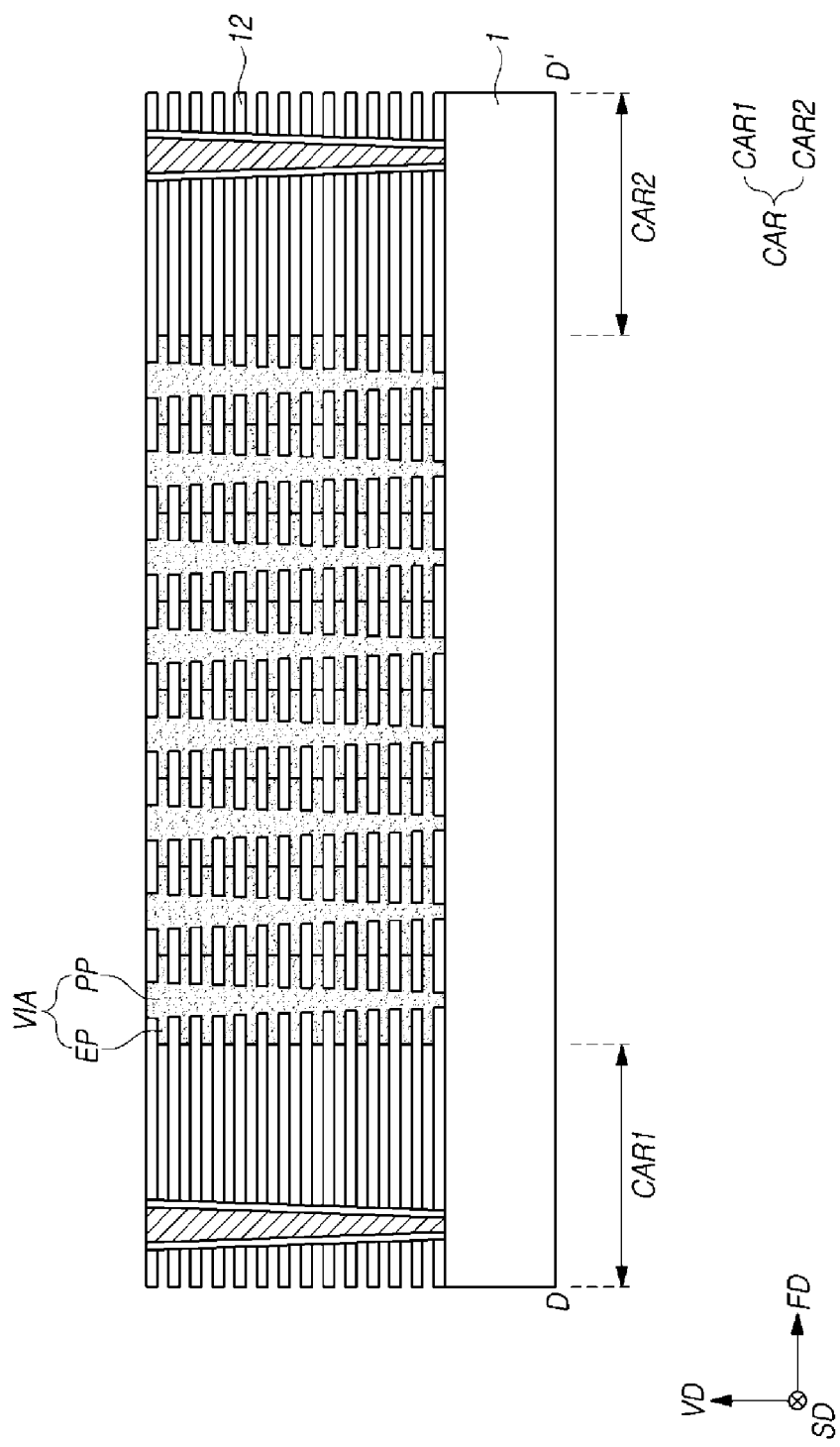

Referring to FIGS. 18A to 18C, an etching process for removing the second dielectric layers 14 of the cell region CAR may be performed. In the etching process, an etching material capable of removing the second dielectric layers 14 may be injected through the slits SLT. An etch barrier 20 may block the penetration of the etching material into to the coupling region CNR. As a result, the second dielectric layers 14 positioned at the outside of the coupling region CNR (including second dielectric layers 14 in the cell region CAR) may be removed, while the second dielectric layers 14 inside the coupling region CNR, which are surrounded by the etch barrier 20, are retained.

Figure 19A:
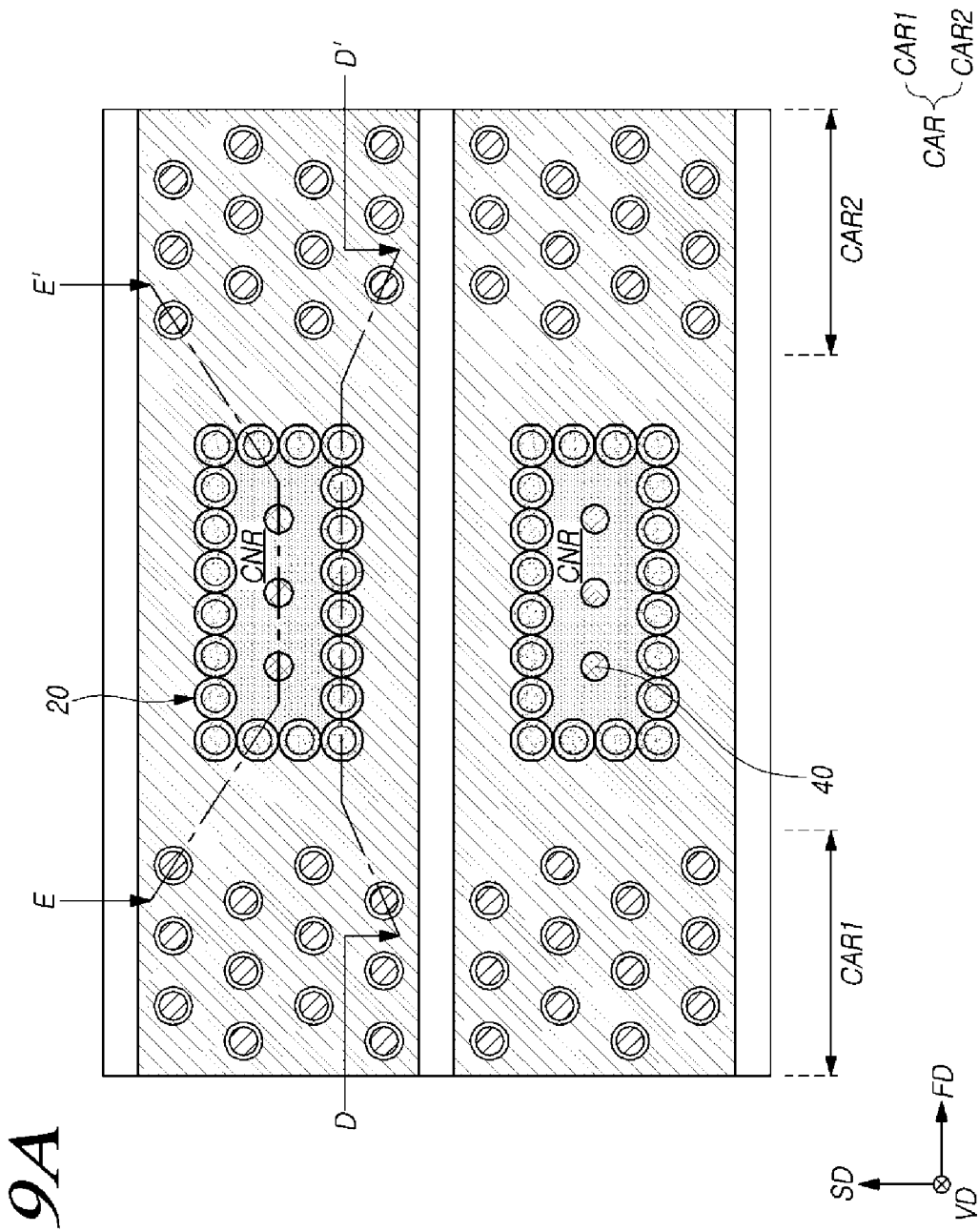
Figure 19B:
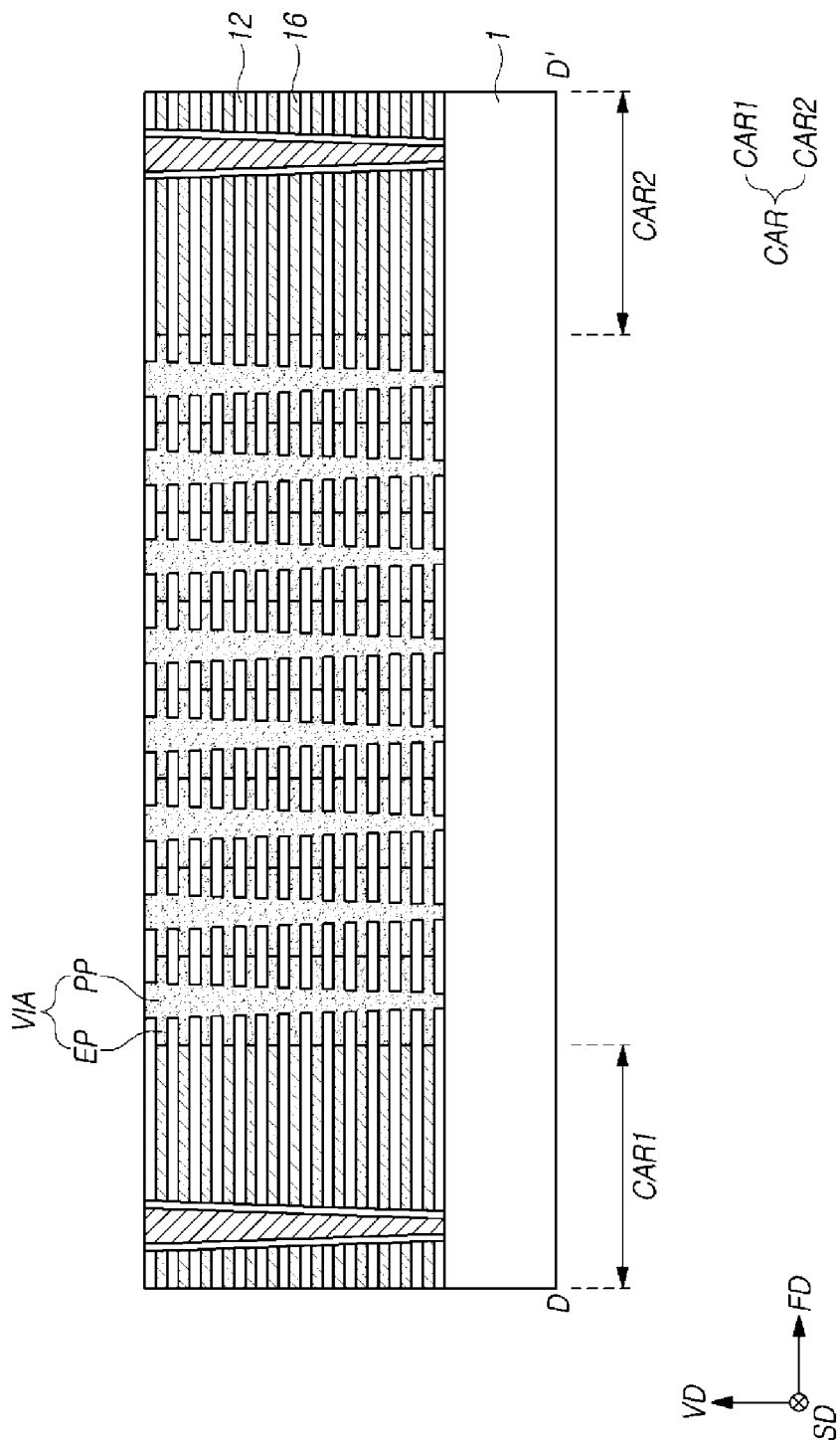
Figure 19C:
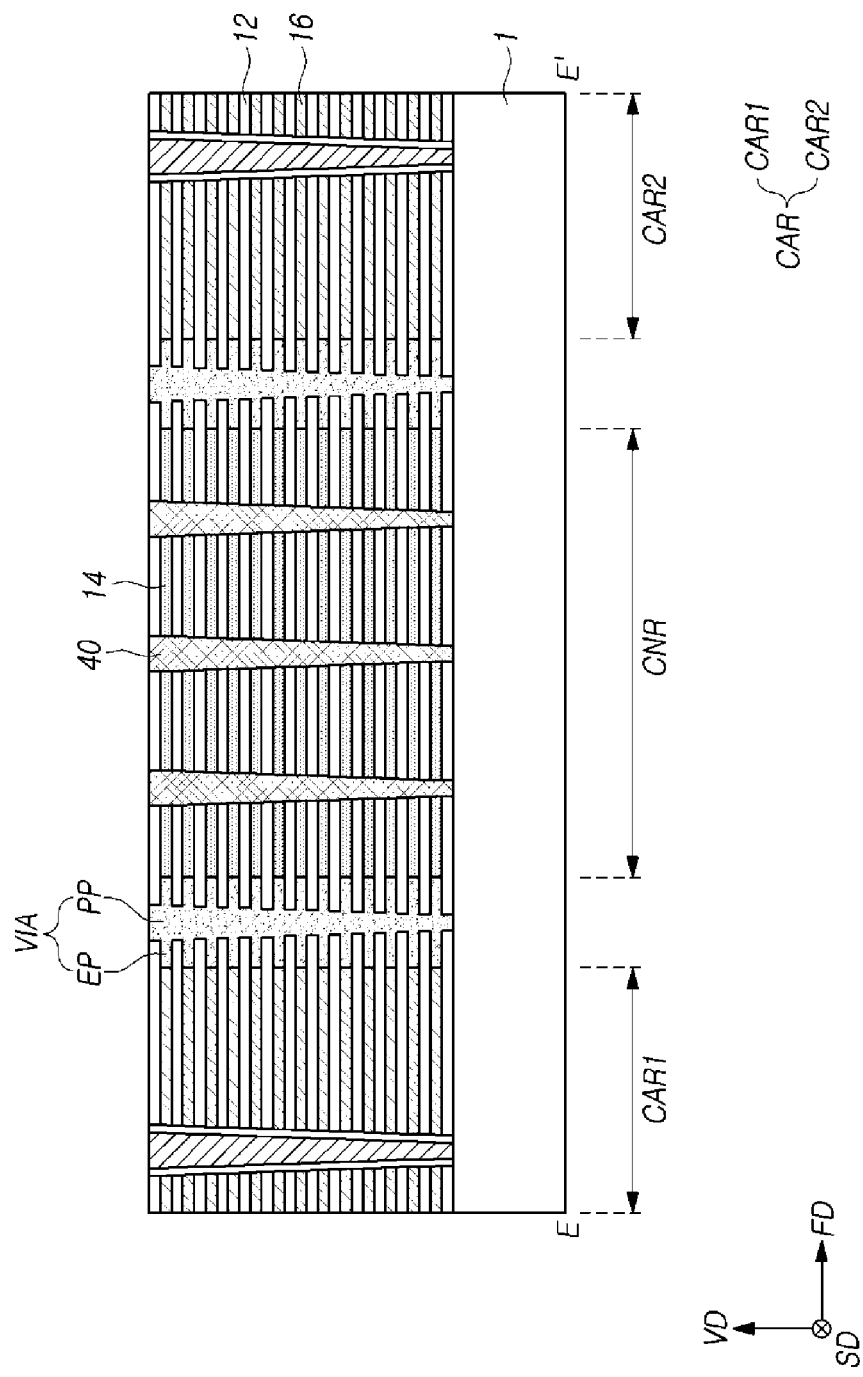

Referring to FIGS. 19A to 19C, by filling a conductive material into spaces from which the second dielectric layers 14 are removed, electrode layers 16 may be formed. For example, the conductive material used as the electrode layers 16 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Contact plugs 40, which vertically pass through the first and second dielectric layers 12 and 14, may be formed in the coupling region CNR.

While the present description illustrates an example in which the contact plugs 40 are formed in a separate process from the process that forms vias VIA, in some embodiments, the contact plugs 40 may be formed together when the vias VIA are formed.

Hereafter, the effects of the disclosure will be described with reference to FIGS. 20, 21A and 21B.

Figure 20:
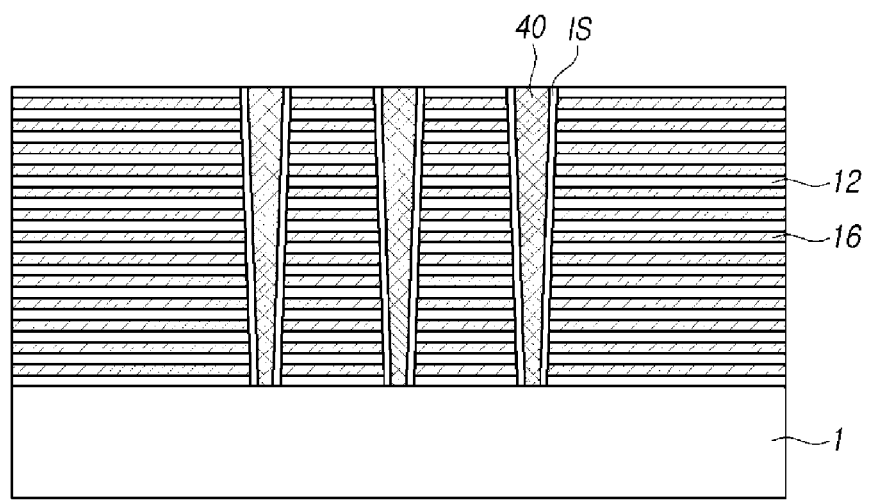
FIG. 20 is a cross-sectional view illustrating a representation of a semiconductor memory device related to the disclosure.

FIG. 20 is a cross-sectional view illustrating a representation of a portion of a semiconductor memory device related to the disclosure.

Referring to FIG. 20, contact plugs 40 may be formed by forming vertical holes formed through first dielectric layers 12 and second dielectric layers (not illustrated), which are alternately stacked, and by forming insulation spacers IS on the sidewalls of the vertical holes, and then by filling a conductive material in the vertical holes. Then, electrode layers 16 may be formed as the second dielectric layers are replaced with a conductive material. Because the electrode layers 16 and the contact plugs 40 are adjacent to each other, with the thin insulation spacers IS interposed therebetween, the coupling between the electrode layers 16 and the contact plugs 40 becomes excessively large, and the electrical characteristics of the semiconductor memory device may be degraded.

Figure 21A:
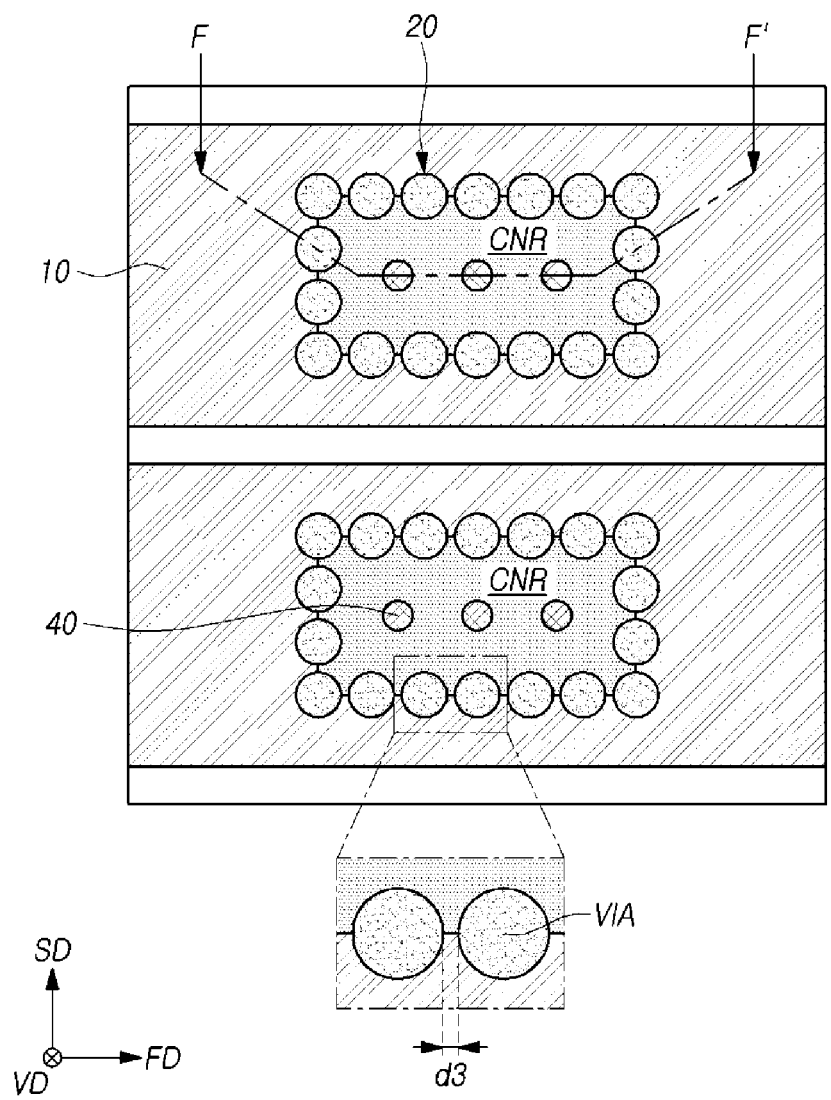
FIG. 21A is a top view illustrating a representation of a semiconductor memory device related to the disclosure.
Figure 21B:
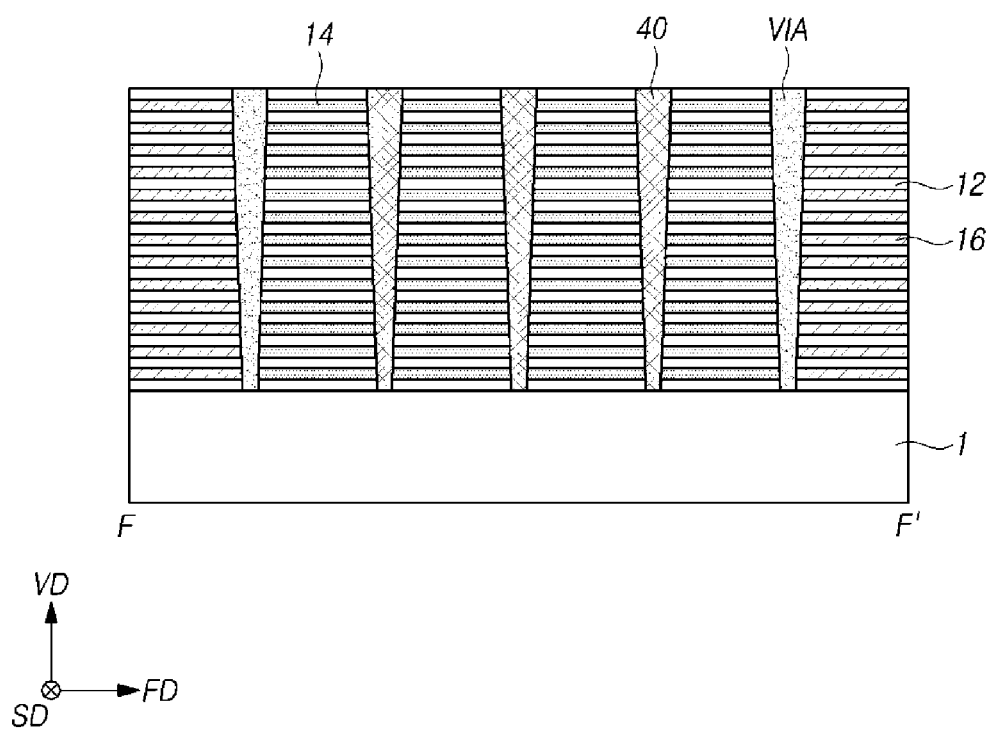
FIG. 21B is a cross-sectional view taken along the line F-F' of FIG. 21A.

FIG. 21A is a top view illustrating a representation of a portion of a semiconductor memory device related to the disclosure, and FIG. 21B is a cross-sectional view taken along the line F-F' of FIG. 21A.

Referring to FIGS. 21A and 21B, a plurality of vias VIA may be formed by filling a plurality of vertical holes that pass through first dielectric layers 12 and second dielectric layers 14. The plurality of vias VIA may be disposed at the edges of a coupling region CNR, and may be made of a material which has an etching selectivity with respect to the second dielectric layers 14. The vias VIA may serve as an etch barrier 20, against removal of the second dielectric layers 14 in the coupling region CNR, in the process of removing the second dielectric layers 14 from other regions as described with reference to FIGS. 18A to 18C.

Therefore, it is possible to prevent the second dielectric layers 14 of the coupling region CNR from being lost or removed during the process of removing the second dielectric layers 14 described above with reference to FIGS. 18A to 18C. Consequently, it is possible to prevent electrode layers 16 from being formed in the coupling region CNR in the process of forming the electrode layers 16 in other regions as described above with reference to FIGS. 19A to 19C. Contact plugs 40 may pass through the first dielectric layers 12 and the second dielectric layers 14 in the coupling region CNR. Unnecessary coupling between the electrode layers 16 and the contact plugs 40 may be avoided by forming an interval between the electrode layers 16 and the contact plugs 40.

However, if an interval d3 between the vias VIA is too wide, etching material can penetrate through the interval d3 between the vias VIA during the process of removing the second dielectric layers 14 that is described above with reference to FIGS. 18A to 18C. In such cases, the second dielectric layers 14 of the coupling region CNR may be removed, and the benefits of spacing the contact plugs from electrode layers 16 is lost. Therefore, it is necessary to narrow the interval d3 between the vias VIA to stop etching material from entering the coupling region CNR.

On the other hand, if the interval d3 between the vias VIA is too small and the gaps too narrow, adjacent vertical holes may stick together. This may occur, for example, due to performance limitations, such as the limit resolution of exposure equipment, in the equipment used in the process of forming the vertical holes. In these instances, as the structural stability of patterns remaining after the vertical holes are formed is degraded, the patterns are likely to lean or collapse, leading to manufacturing failures.

According to embodiments of the disclosure, vertical holes that provide spaces for forming the vias VIA are formed by being divided into the process of forming the vertical holes VH described above with reference to FIGS. 14A to 14C, and the process of forming the recesses R described above with reference to FIGS. 15A to 15C. Accordingly, the vias VIA may play the role of the etch barrier 20 even without excessively narrowing the interval between the vertical holes VH. Therefore, the structural stability of patterns remaining after the vertical holes VH are formed may be enhanced, and failures in which the patterns lean or collapse may be suppressed or prevented.

In summary, according to embodiments of the disclosure, it is possible to prevent coupling between the electrode layers 16 and the contact plugs 40, or to suppress the coupling from increasing excessively. Therefore, electrical characteristics are improved, and the occurrences of pattern failures during manufacturing processes are reduced or eliminated.

Figure 22:
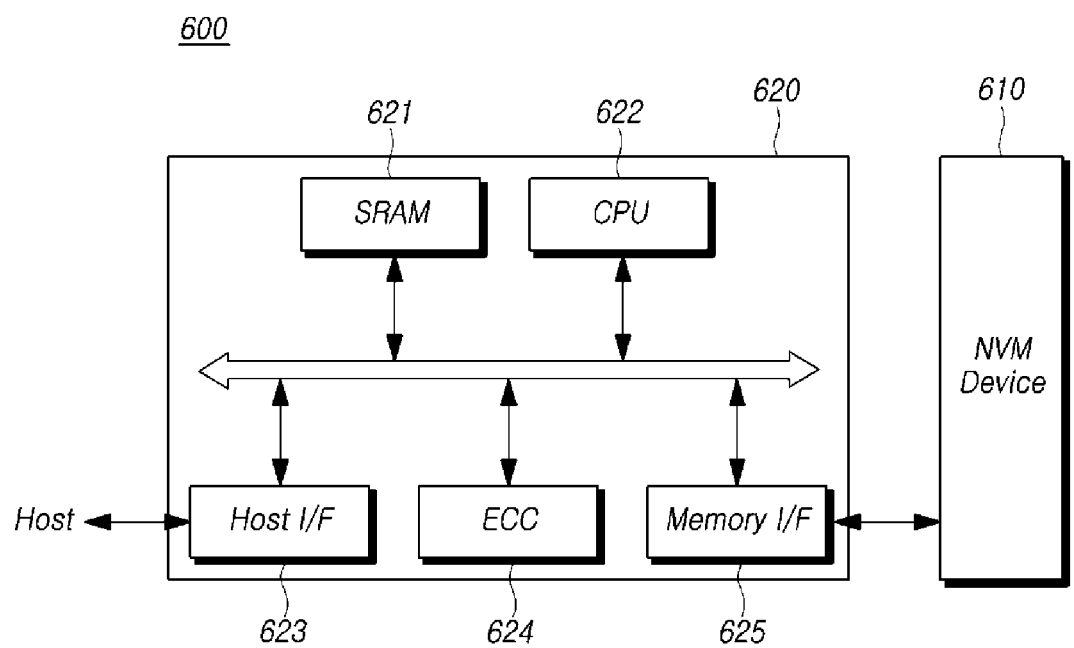
FIG. 22 is a diagram schematically illustrating a representation of a memory system including a semiconductor memory device in accordance with an embodiment of the disclosure.

FIG. 22 is a block diagram schematically illustrating a representation of a memory system including a semiconductor memory device in accordance with an embodiment of the disclosure.

Referring to FIG. 22, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 23:
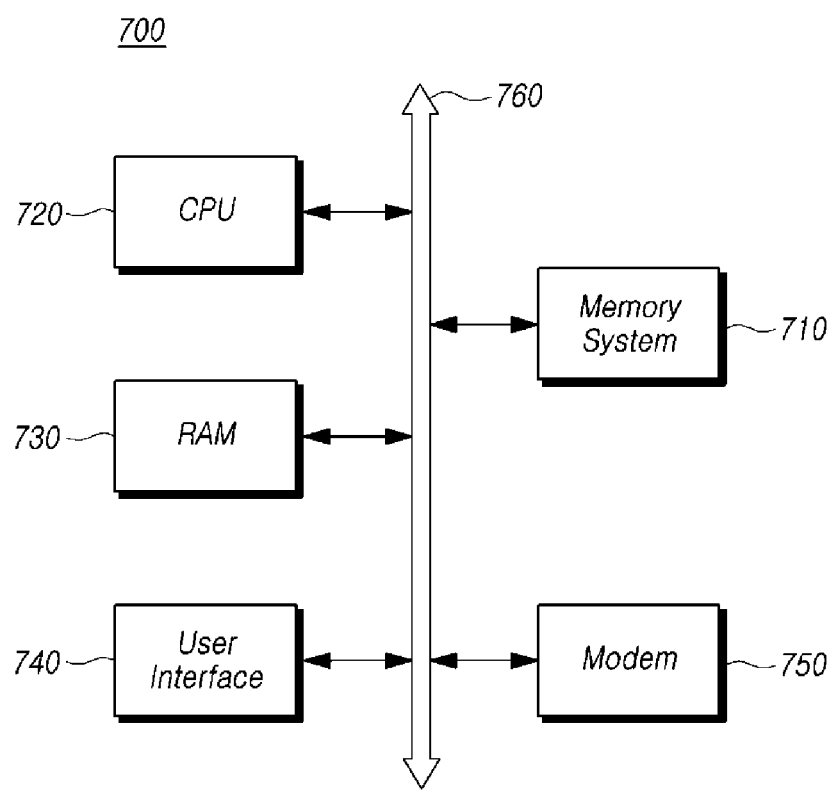
FIG. 23 is a block diagram schematically illustrating a representation of a computing system including a semiconductor memory device in accordance with an embodiment of the disclosure.

FIG. 23 is a block diagram schematically illustrating a representation of a computing system including a semiconductor memory device in accordance with an embodiment of the disclosure.

Referring to FIG. 23, a computing system 700 in accordance with an embodiment may include a memory system

710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
    a stack structure including a plurality of first dielectric layers alternately stacked with a plurality of second dielectric layers over a first substrate in a coupling region, and including a plurality of electrode layers alternately stacked with the plurality of first dielectric layers over the first substrate outside the coupling region; and
    a plurality of vias passing through the stack structure in a first direction that is perpendicular to a top surface of the first substrate and disposed at edges of the coupling region to define an etch barrier,
    each of the plurality of vias comprising:
    a pillar portion extending in the first direction; and
    a plurality of extended portions, extending radially from an outer circumference of the pillar portion and parallel to the top surface of the first substrate, that are coextensive in the first direction with the plurality of second dielectric layers.

2. The semiconductor memory device according to claim 1, wherein pillar portions of adjacent vias are spaced apart from each other with a first interval, and extended portions of the adjacent vias are in contact with each other.

3. The semiconductor memory device according to claim 1, wherein pillar portions of adjacent vias are spaced apart from each other with a first interval, and extended portions of the adjacent vias are spaced apart from each other with a second interval that is smaller than the first interval.

4. The semiconductor memory device according to claim 1, wherein the vias are disposed at all edges of the coupling region.

5. The semiconductor memory device according to claim 1, further comprising:
    a plurality of slits extending in a second direction and spaced apart in a third direction to divide the stack structure,
    wherein, between two adjacent slits, the plurality of vias are disposed at edges of the coupling region that extend in the second direction and are spaced apart in the third direction, and
    wherein the vias are not disposed at edges of the coupling region that extend in the third direction and are spaced apart in the second direction.

6. The semiconductor memory device according to claim 5, wherein, between the two adjacent slits, the plurality of vias are disposed as a pair of via rows that extend in the second direction.

7. The semiconductor memory device according to claim 6, wherein the edges of the coupling region without the vias are disposed away from ends of the via rows in the second direction toward a center of the coupling region.

8. The semiconductor memory device according to claim 1, wherein the etch barrier comprises a material having an etching selectivity with respect to the second dielectric layers.

9. The semiconductor memory device according to claim 1, wherein the pillar portions and the extended portions of the plurality of vias are made of the same material.

10. The semiconductor memory device according to claim 1, wherein the pillar portion comprises a single material.

11. The semiconductor memory device according to claim 1, further comprising:
    a contact plug passing in the first direction through the stack structure in the coupling region.

12. The semiconductor memory device according to claim 11, wherein the plurality of vias and the contact plug comprise the same material.

13. The semiconductor memory device according to claim 1, wherein the pillar portion comprises:
    a first layer formed from a first material and having a shape of a cylindrical shell whose central region is open; and
    a second layer disposed in the open central region of the first layer and formed from a second material different from the first material.

14. The semiconductor memory device according to claim 13, wherein the first layer includes a dielectric material, and the second layer includes a conductive material.

15. The semiconductor memory device according to claim 13, further comprising:
    a contact plug formed from the second material and passing in the first direction through the stack structure in the coupling region.

16. The semiconductor memory device according to claim 1, further comprising:
    a logic structure, including a logic circuit, that is disposed between the first substrate and a second substrate disposed below the first substrate; and
    a contact plug, passing in the first direction through the stack structure and the first substrate in the coupling region, that is coupled with the logic circuit.

17. The semiconductor memory device according to claim 1, further comprising:
    a plurality of channels passing in the first direction through the plurality of electrode layers alternately stacked with the plurality of the first dielectric layers;
    a plurality of bit lines disposed over the stack structure and coupled to the plurality of channels through bit line contacts;
    a first pad disposed over a bit line and coupled to one of the plurality of bit lines and one of the plurality of electrode layers;

an external pad disposed under a bottom surface of the first substrate, away from the top surface of the first substrate over which the stack structure is disposed;

a contact plug coupling the first pad and the external pad by passing in the first direction through the stack structure and the first substrate in the coupling region; and a logic structure including a logic circuit, disposed over a second substrate, and a second pad which is coupled with the logic circuit and is bonded to the first pad.

18. A semiconductor memory device comprising:

a stack structure; and a plurality of vias passing through the stack structure and disposed at edges of a coupling region to define an etch barrier, wherein the stack structure includes a plurality of first dielectric layers alternately stacked with a plurality of second dielectric layers along a first direction in the coupling region, and includes a plurality of electrode layers alternately stacked with the plurality of first dielectric layers along the first direction outside the coupling region, and wherein each of the plurality of vias comprises:

a pillar portion passing through the stack structure in the first direction; and a plurality of extended portions extending in a radial direction from a side surface of the pillar portion and perpendicular to the first direction, at the same layers as the second dielectric layers.

19. The semiconductor memory device according to claim 18, wherein pillar portions of adjacent vias are spaced apart from each other with a first interval, and extended portions of the adjacent vias are in contact with each other.

20. The semiconductor memory device according to claim 18, wherein pillar portions of adjacent vias are spaced apart from each other with a first interval, and extended portions of the adjacent vias are spaced apart from each other with a second interval that is smaller than the first interval.

21. The semiconductor memory device according to claim 18, wherein the vias are disposed at all edges of the coupling region.

22. The semiconductor memory device according to claim 18, further comprising:

a plurality of slits dividing the stack structure, wherein the vias are disposed, between the slits, at edges of the coupling region which face adjacent slits, and are not disposed at edges of the coupling region which do not face the slits.

23. The semiconductor memory device according to claim 22, wherein, between the adjacent slits, the plurality of vias configure a pair of via rows.

24. The semiconductor memory device according to claim 23, wherein, in an extending direction of the slits, both edges of the coupling region are defined inwardly away from both ends of the via rows.

25. The semiconductor memory device according to claim 18, wherein the vias are made of a material with an etching selectivity with respect to the second dielectric layers.

26. The semiconductor memory device according to claim 18, wherein the pillar portion and the extended portions of the via are made of the same material.

27. The semiconductor memory device according to claim 18, wherein the pillar portion is made of a single material.

28. The semiconductor memory device according to claim 18, further comprising:

a contact plug passing in the first direction through the stack structure in the coupling region.

29. The semiconductor memory device according to claim 28, wherein the vias are made of the same material as the contact plug.

30. The semiconductor memory device according to claim 18, wherein the pillar portion comprises:

a first layer having a shape of a cylindrical shell whose central region is open; and a second layer disposed in the open central region of the first layer, and made of a material different from the material of the first layer.

31. The semiconductor memory device according to claim 30, wherein the first layer includes a dielectric material, and the second layer includes a conductive material.

32. The semiconductor memory device according to claim 30, further comprising:

a contact plug passing in the first direction through the stack structure in the coupling region, wherein the second layer is made of the same material as the contact plug.

33. The semiconductor memory device according to claim 18, further comprising:

a logic structure, disposed below the stack structure and the plurality of vias, that includes a logic circuit; and a contact plug, passing in the first direction through the stack structure in the coupling region, that is coupled with the logic circuit.

34. The semiconductor memory device according to claim 21, further comprising:

a plurality of channels passing in the first direction through the plurality of electrode layers alternately stacked with the plurality of the first dielectric layers;

a plurality of bit lines disposed over the stack structure and the plurality of vias, and coupled to the plurality of channels through bit line contacts;

a first pad disposed over the bit lines, and coupled to one of the bit lines and one of the electrode layers;

an external pad disposed to be spaced apart from the first pad with the stack structure interposed therebetween;

a contact plug coupling the first pad and the external pad by passing through the stack structure in the coupling region; and a logic structure including a logic circuit and a second pad that is coupled with the logic circuit and is bonded to the first pad.

* * * * *